(12) United States Patent
Chen et al.

(10) Patent No.: US 12,727,082 B2
(45) Date of Patent: Sep. 1, 2026

(54) CIRCUIT BOARD AND LIGHT-EMITTING PANEL WITH CIRCUIT BOARD

(71) Applicant: AUO Corporation, Hsin-Chu (TW)

(72) Inventors: Chieh-Ming Chen, Hsin-Chu (TW); Kuo-Hsuan Huang, Hsin-Chu (TW); Bo-Ru Jian, Hsin-Chu (TW); Jui-Ping Yu, Hsin-Chu (TW); Ta-Wen Liao, Hsin-Chu (TW); Yu-Chin Wu, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 366 days.

(21) Appl. No.: 18/542,833

(22) Filed: Dec. 18, 2023

(65) Prior Publication Data

US 2025/0008649 A1 Jan. 2, 2025

(30) Foreign Application Priority Data

Jun. 27, 2023 (TW) ................................ 112123956

(51) Int. Cl.
*H05K 1/11* (2006.01)
*H10W 90/00* (2026.01)

(52) U.S. Cl.
CPC ............ *H05K 1/111* (2013.01); *H10W 90/00* (2026.01); *H05K 2201/09409* (2013.01); *H05K 2201/10106* (2013.01)

(58) Field of Classification Search
CPC ........ H10W 90/00; H05K 2201/09409; H05K 1/111; H05K 2201/10106; H10D 86/60; H10D 86/441; H10H 20/857; H10H 29/142; H10H 20/84; G09G 3/32; G09G 2300/0426; G09G 2330/08
See application file for complete search history.

(56) References Cited

U.S. PATENT DOCUMENTS

| | | | | |
|---|---|---|---|---|
| 12,015,103 | B2 * | 6/2024 | Lo | C30B 25/183 |
| 2013/0078745 | A1 * | 3/2013 | Wang | G01R 31/2884 438/15 |
| 2014/0267683 | A1 | 9/2014 | Bibl et al. | |
| 2019/0157340 | A1 * | 5/2019 | Liao | G09G 3/006 |
| 2020/0235128 | A1 | 7/2020 | Shin et al. | |

(Continued)

FOREIGN PATENT DOCUMENTS

| | | | |
|---|---|---|---|
| KR | 20200091347 | A | 7/2020 |
| KR | 20210017674 | A | 2/2021 |
| TW | 202147281 | A | 12/2021 |

*Primary Examiner* — Victor A Mandala
(74) *Attorney, Agent, or Firm* — WPAT, PC

(57) ABSTRACT

A circuit board includes a plurality of pixel areas. Each pixel area includes a plurality of electrode pad groups. The electrode pad groups are arranged in a first direction. Each of the electrode pad groups includes a first electrode pad, a second electrode pad, and a third electrode pad. The first electrode pad, the second electrode pad, and the third electrode pad are arranged in a second direction. The second direction is different from the first direction. The first electrode pad is disposed between the second electrode pad and the third electrode pad. The first electrode pad is configured to provide a first voltage potential. The second electrode pad and the third electrode pad are configured to provide a second voltage potential. The first voltage potential is different from the second voltage potential.

20 Claims, 27 Drawing Sheets

(56) References Cited

U.S. PATENT DOCUMENTS

2020/0411393 A1* 12/2020 Kim .................. G01R 27/2605
2021/0043616 A1* 2/2021 Jung ..................... G09G 3/006
2021/0159363 A1* 5/2021 Xu ...................... H10D 86/441
2021/0359155 A1* 11/2021 Chaji .................... G09G 3/006
2021/0384177 A1* 12/2021 Liu ..................... H10H 20/853
2021/0408349 A1* 12/2021 Cai ....................... H10H 20/01
2022/0302174 A1* 9/2022 Ruan ................ G02F 1/136259
2023/0006117 A1* 1/2023 Suzuki .................. H10H 20/01
2023/0102061 A1* 3/2023 Watsuda ............. H10H 20/857
257/773
2023/0112531 A1* 4/2023 Wu ....................... H10H 20/01
257/91

* cited by examiner

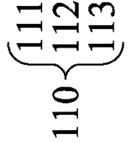
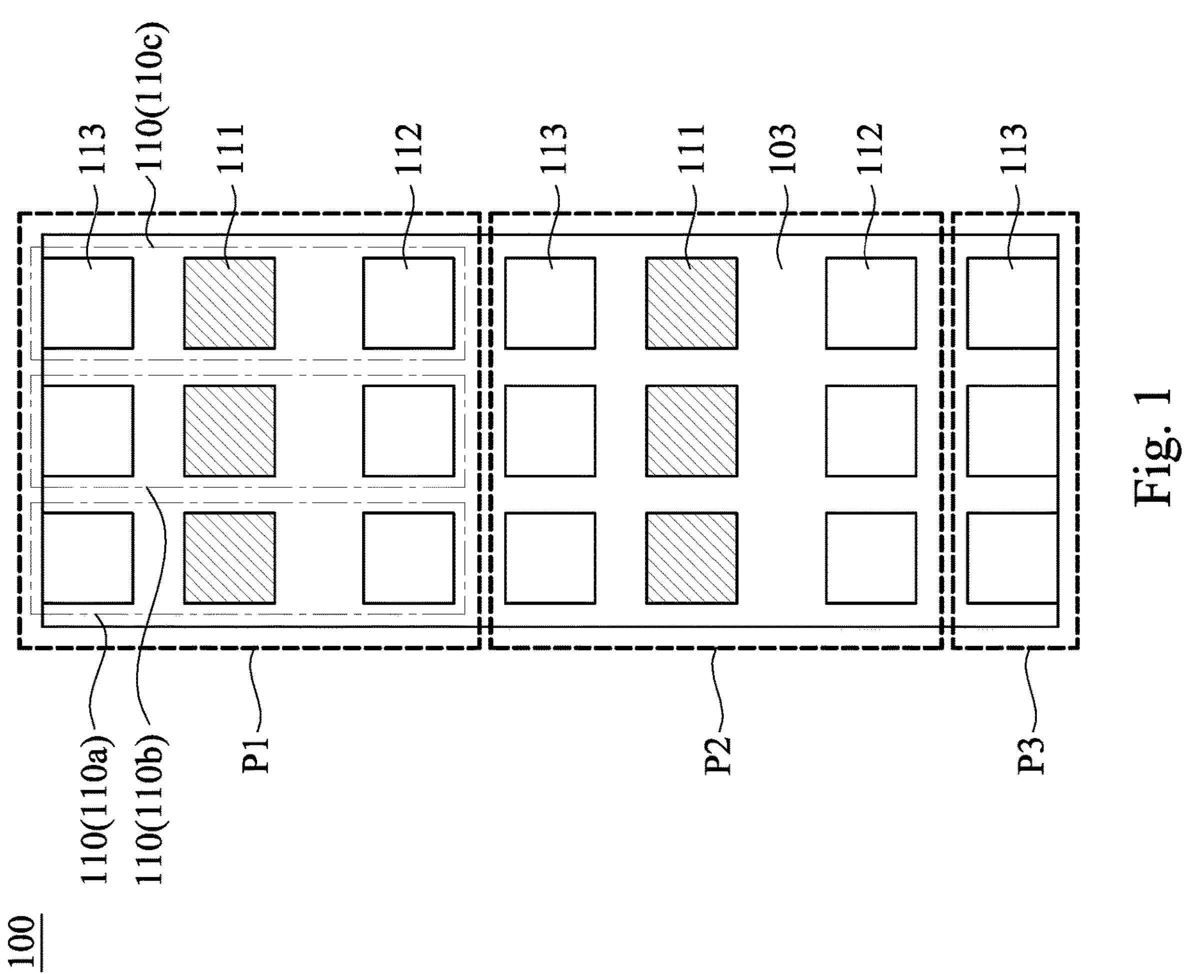
Fig. 1
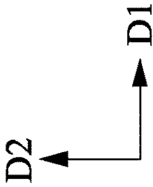

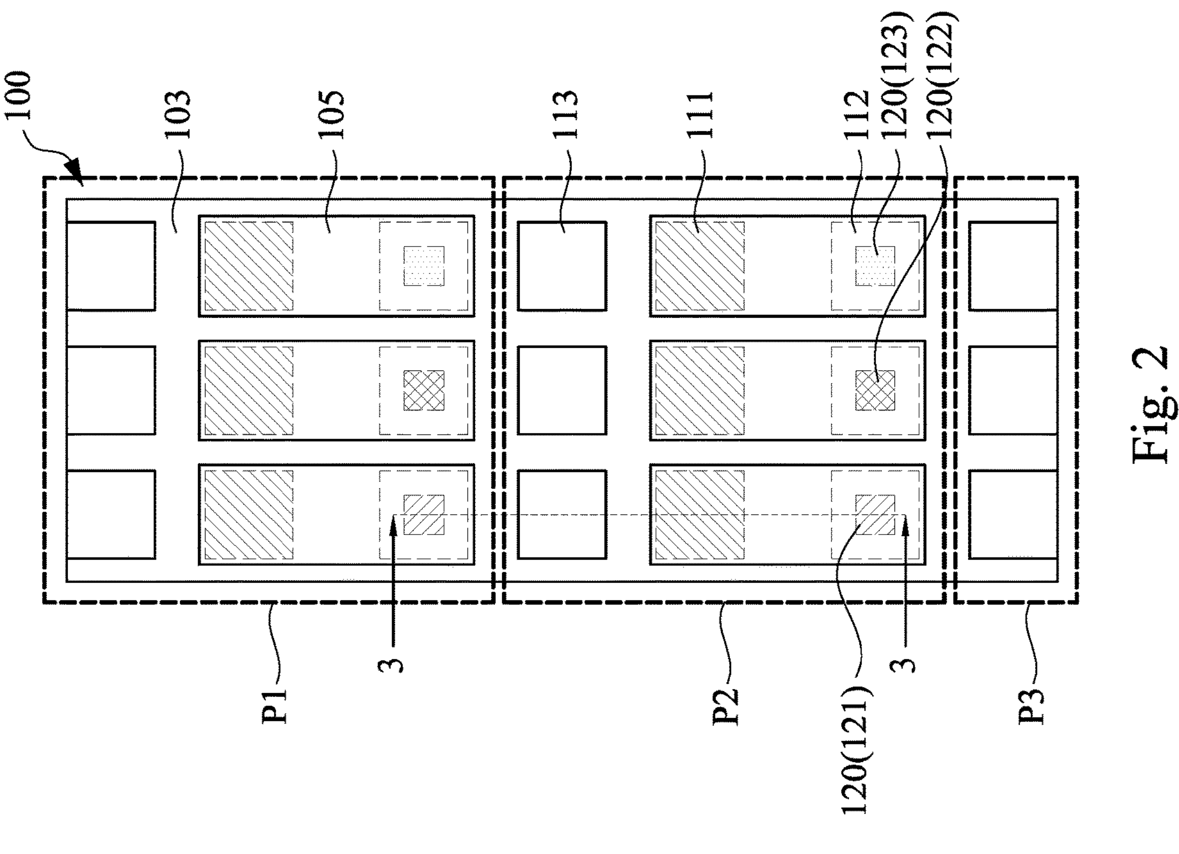
Fig. 2
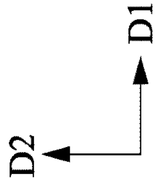

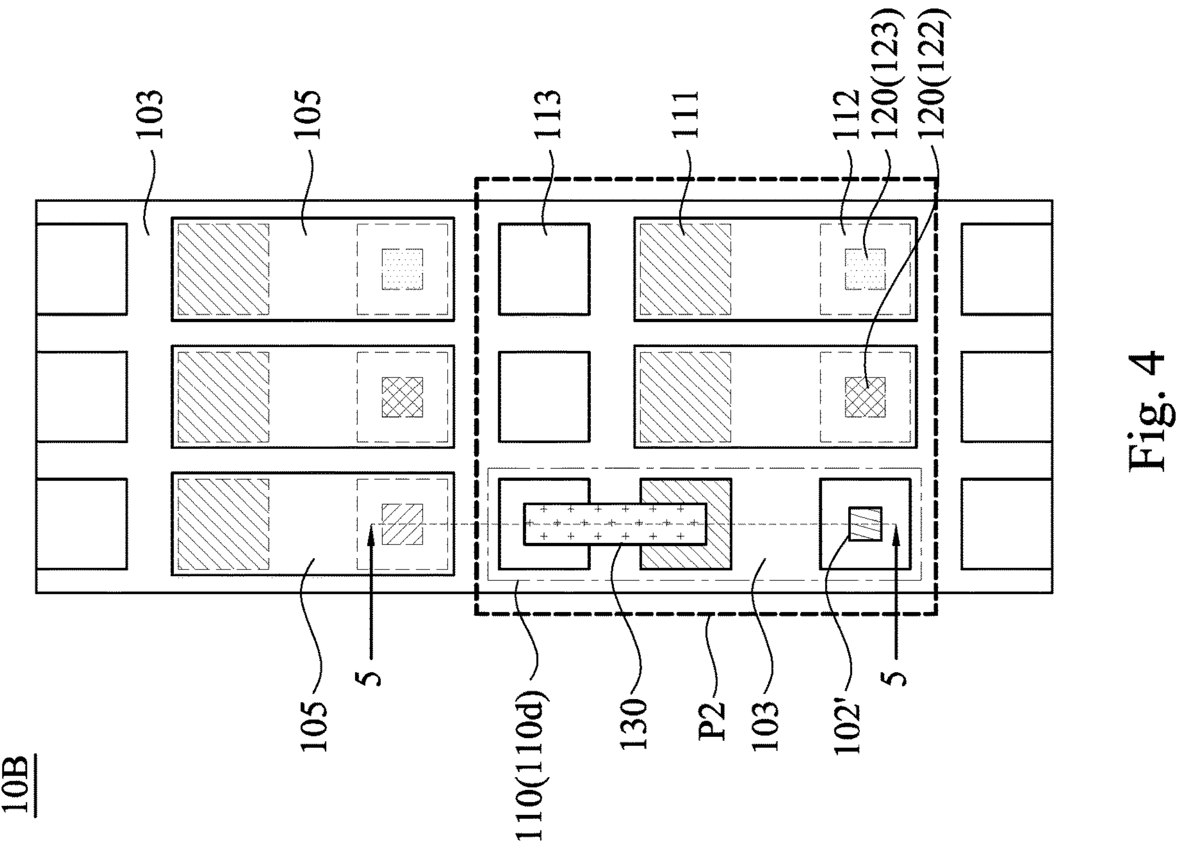
Fig. 4
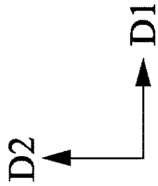

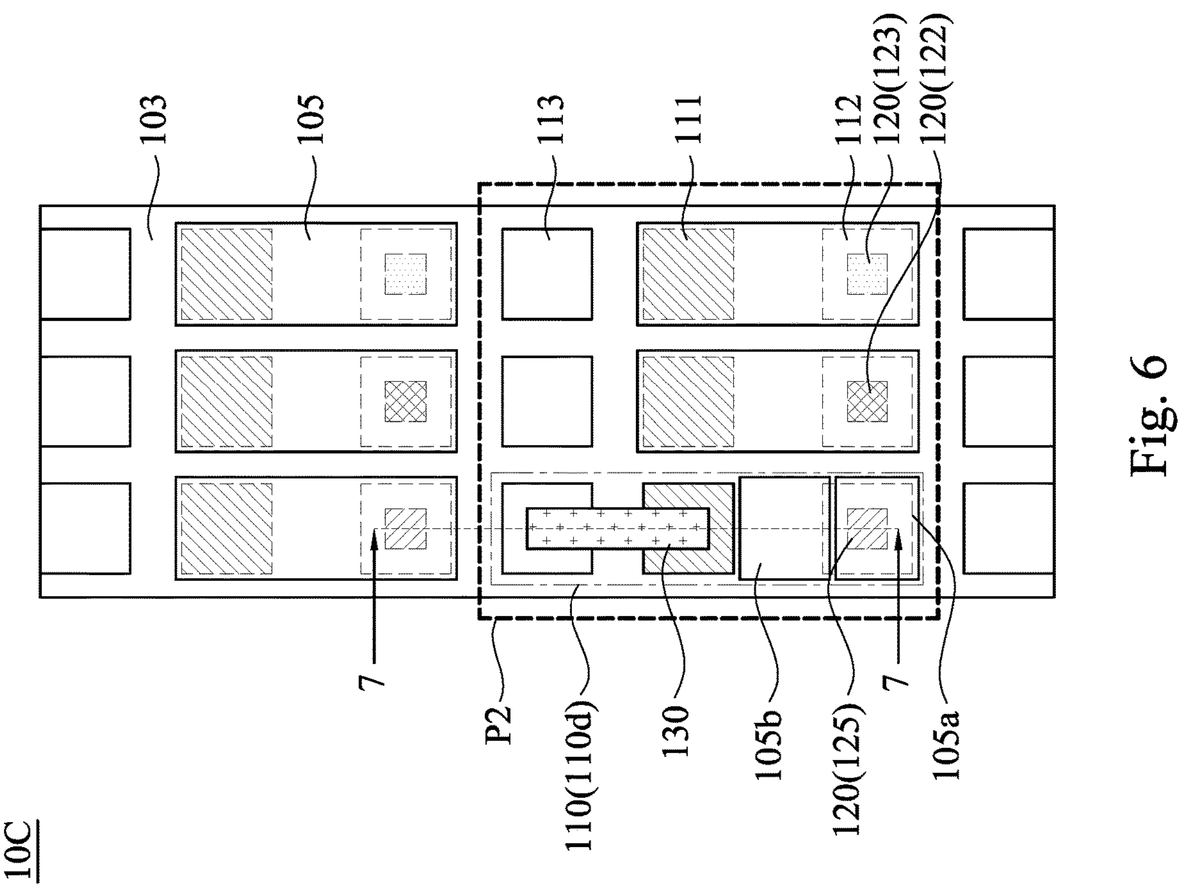
Fig. 6
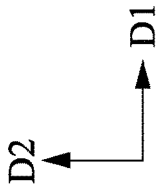

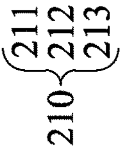
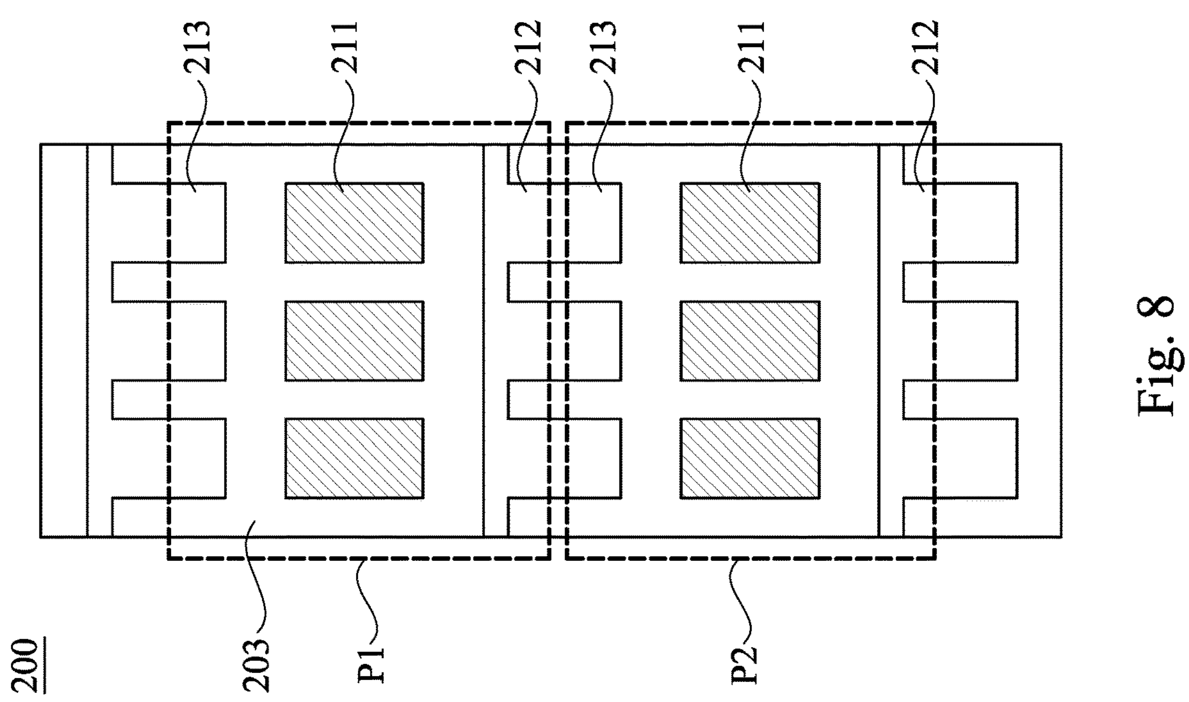
Fig. 8
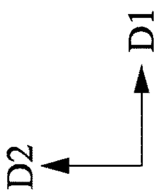

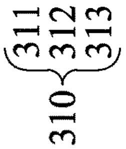
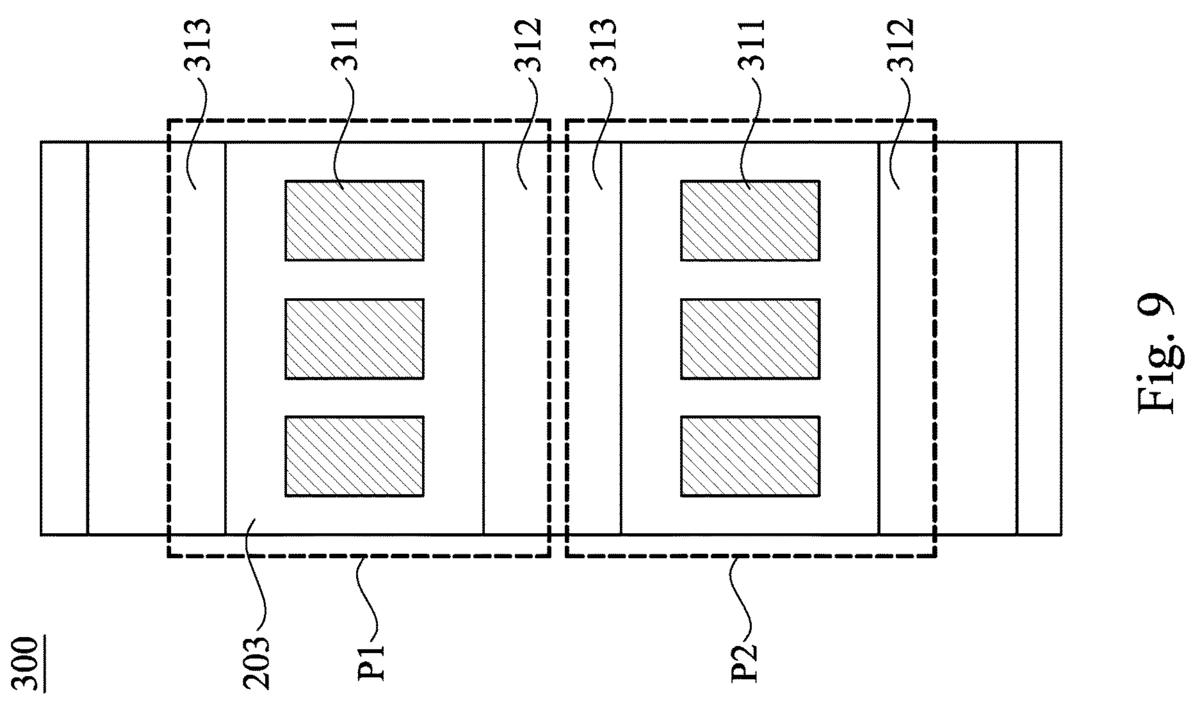
Fig. 9
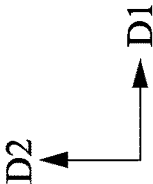

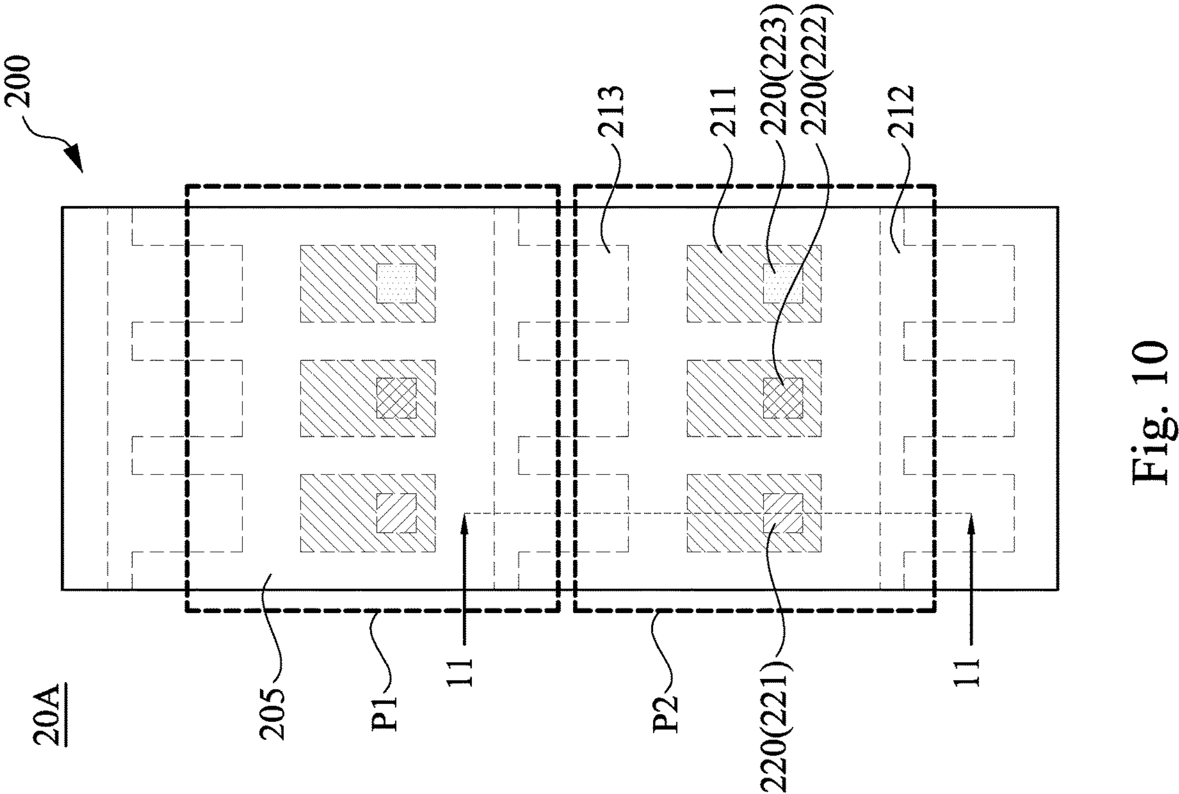
Fig. 10
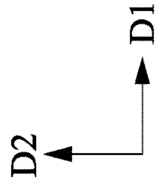

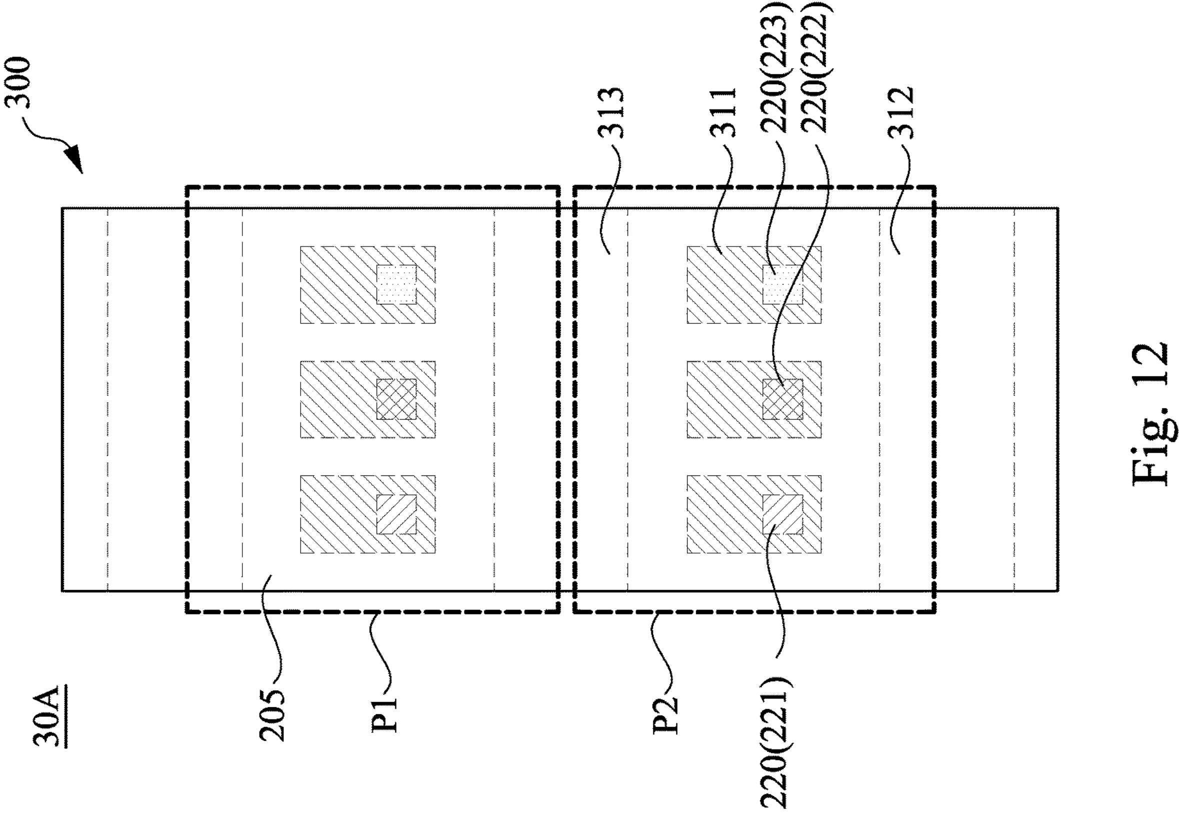
Fig. 12
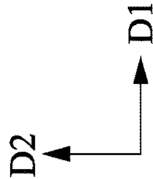

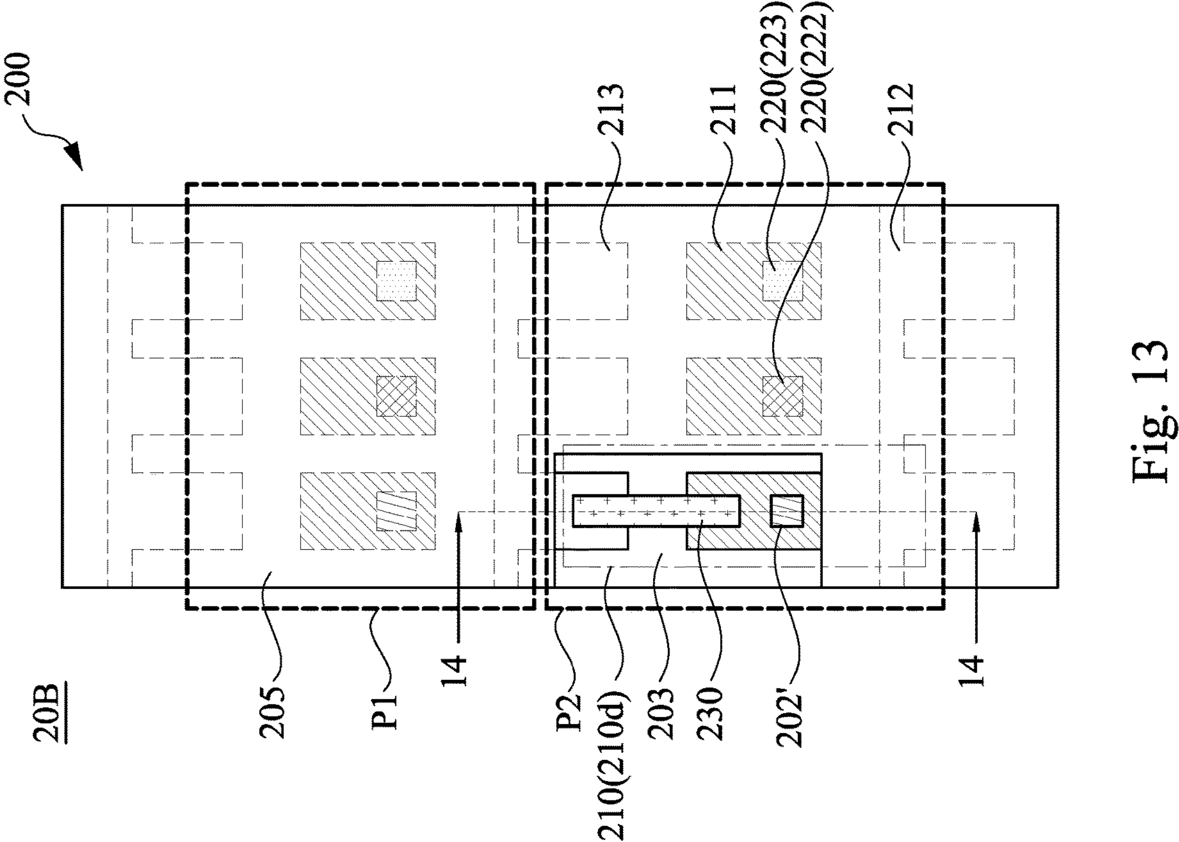
Fig. 13
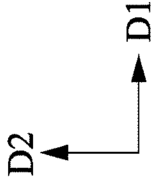

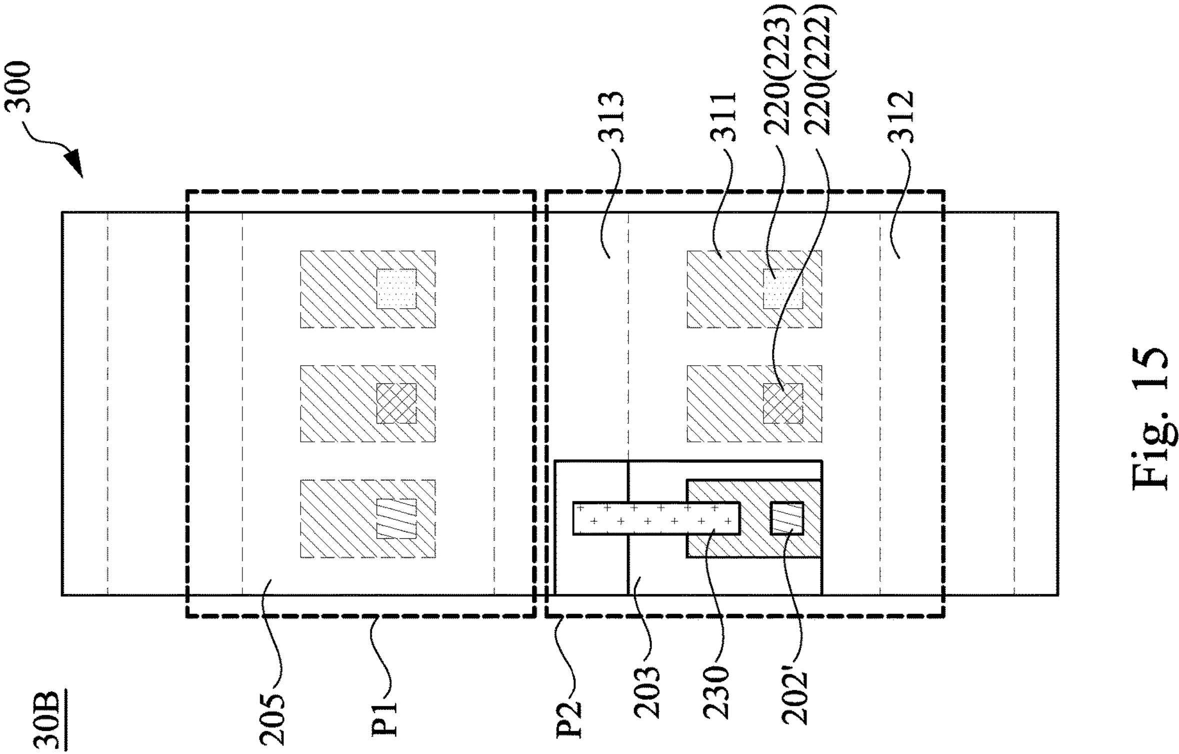
Fig. 15
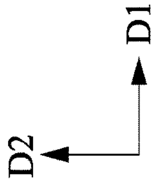

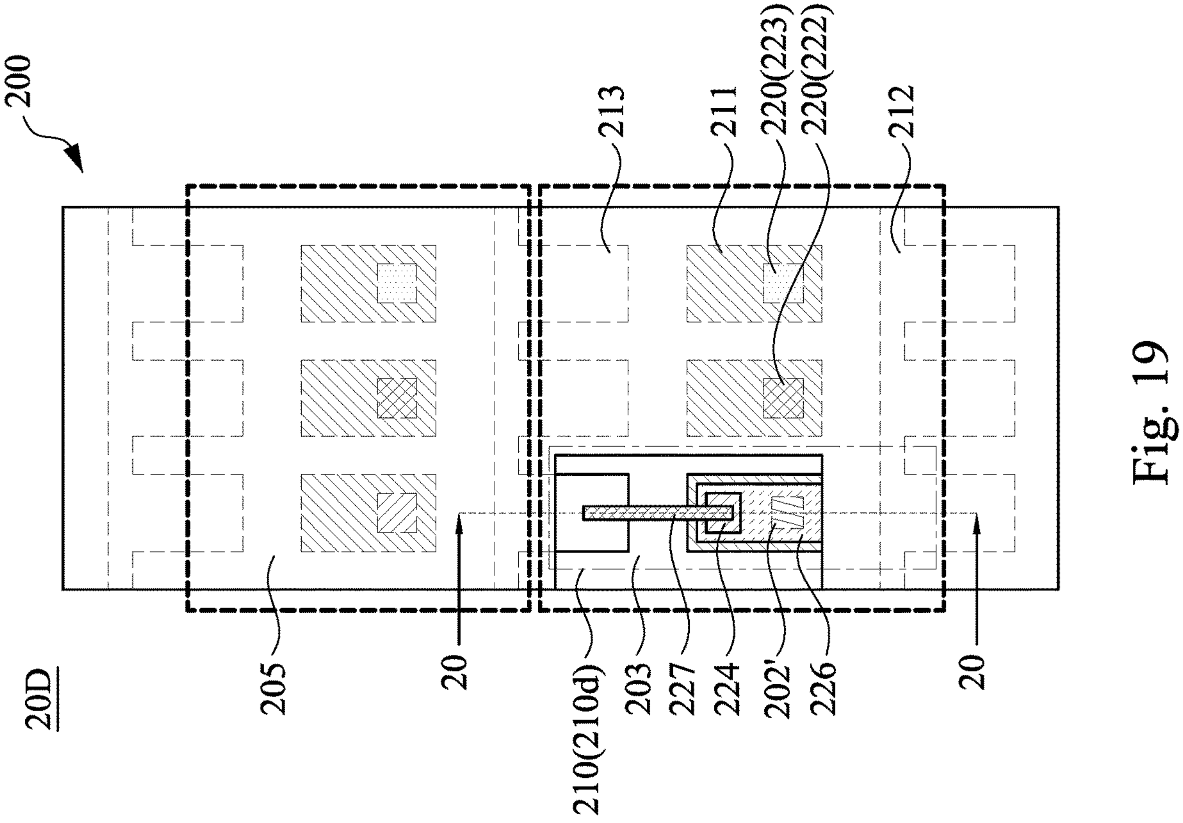
Fig. 19
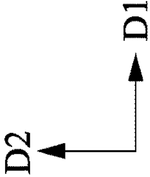

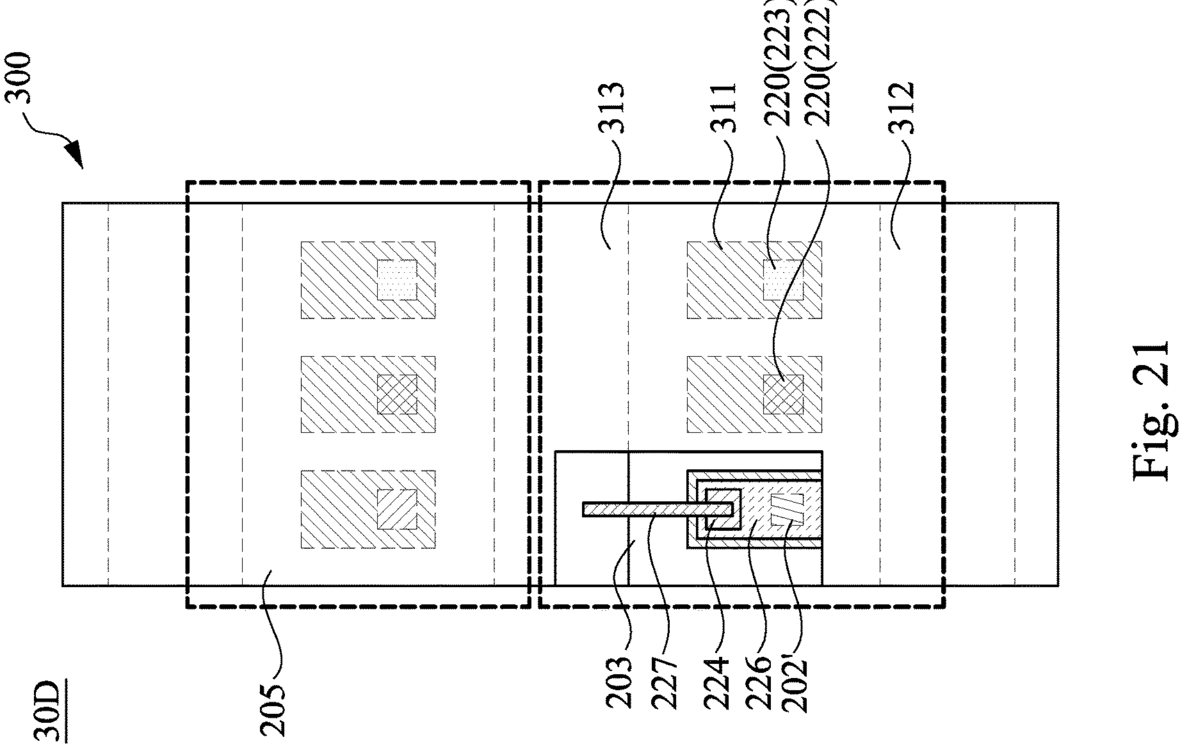
Fig. 21
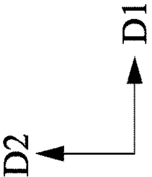

Fig. 23

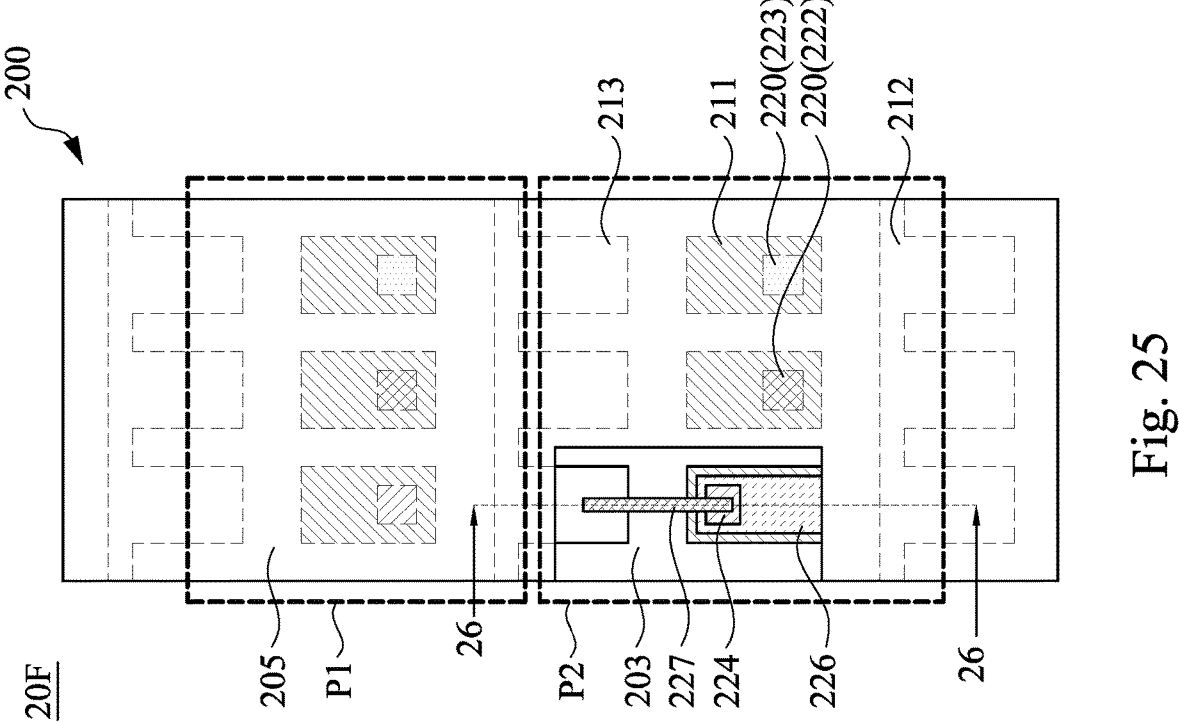
Fig. 25
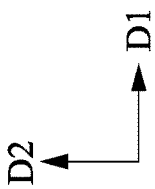

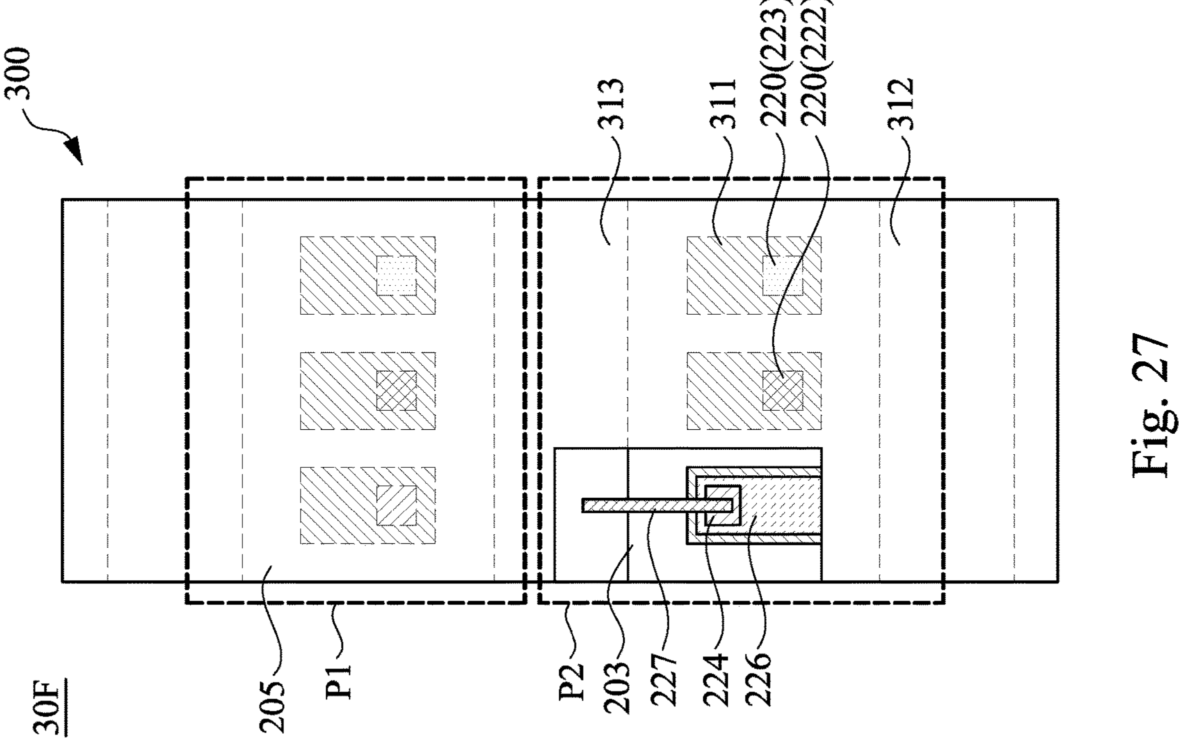
Fig. 27
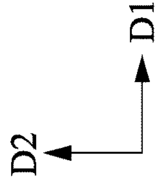

CIRCUIT BOARD AND LIGHT-EMITTING PANEL WITH CIRCUIT BOARD

CROSS-REFERENCE TO RELATED APPLICATION

This application claims priority to Taiwan Application Serial Number 112123956, filed Jun. 27, 2023, which is herein incorporated by reference.

BACKGROUND

Field of Invention

The present disclosure relates to a circuit board and a light-emitting panel with the circuit board.

Description of Related Art

Light-emitting diodes (LEDs) are common light-emitting units. They have the characteristics of low power consumption, high brightness, and high color saturation. Therefore, they are suitable for pixel structures of light-emitting panels.

In the fabrication of the LEDs, the technology of transferring them from one substrate to one target substrate is called mass transfer. When transferring the LEDs using the existing technology, faults such as errors during transposition or malfunctioning LEDs may occur. Thus, some pixels in the light-emitting panels may not work normally and the yield rate may be affected. In turn, the faulty LEDs will be removed, and substitute LEDs will be replaced onto the circuit board.

However, in most cases, the electrode pads reserved for repairing one light-emitting diode are disposed on the sides of the two electrode pads where it is connected, resulting in a decrease in the area utilization of the circuit board. Therefore, such an arrangement is not suitable for high pixel density applications. In addition, the electrode pads for repair are not protected during the mass transfers of the LEDs. Therefore, contamination may arise and the bonding after repair may be adversely affected.

Accordingly, how to provide a circuit board and a light-emitting panel to solve the aforementioned problems becomes an important issue to be solved by those in the industry.

SUMMARY

An aspect of the disclosure is to provide a circuit board and a light-emitting panel with the circuit board that may efficiently solve the aforementioned problems.

According to some embodiments of the disclosure, a circuit board includes a plurality of pixel areas. Each of the pixel areas includes a plurality of electrode pad groups. The electrode pad groups are arranged in a first direction. Each of the electrode pad groups includes a first electrode pad, a second electrode pad, and a third electrode pad. The first electrode pad, the second electrode pad, and the third electrode pad are arranged in a second direction. The second direction is different from the first direction. The first electrode pad is disposed between the second electrode pad and the third electrode pad. The first electrode pad is configured to provide a first voltage potential. The second electrode pad and the third electrode pad are configured to provide a second voltage potential. The first voltage potential is different from the second voltage potential.

In some embodiments, in any two adjacent pixel areas in the second direction, the second electrode pad of the electrode pad groups of one of the two adjacent pixel areas and the third electrode pad of the electrode pad groups of the other of the two adjacent pixel areas form a continuous structure.

In some embodiments, the second electrode pads of any two adjacent electrode pad groups form a continuous structure.

In some embodiments, the third electrode pads of any two adjacent electrode pad groups form a continuous structure.

According to some other embodiments of the disclosure, a light-emitting panel includes a circuit board and a plurality of light-emitting units. The circuit board includes a plurality of pixel areas. Each of the pixel areas includes a plurality of electrode pad groups. The electrode pad groups are arranged in a first direction. Each of the electrode pad groups includes a first electrode pad, a second electrode pad, and a third electrode pad. The first electrode pad, the second electrode pad, and the third electrode pad are arranged in a second direction. The second direction is different from the first direction. The first electrode pad is disposed between the second electrode pad and the third electrode pad. The first electrode pad is configured to provide a first voltage potential. The second electrode pad and the third electrode pad are configured to provide a second voltage potential. The first voltage potential is different from the second voltage potential. The light-emitting units are arranged in the first direction. The light-emitting units are disposed in the pixel areas. The light-emitting units correspond to the electrode pad groups. Each of the light-emitting units includes a first electrode and a second electrode. The first electrode is electrically connected to the first electrode pad of a corresponding one of the electrode pad groups. The second electrode is electrically connected to the second electrode of the corresponding one of the electrode pad groups.

In some embodiments, the light-emitting panel further includes a substitute light-emitting unit in a first one of the pixel areas. The substitute light-emitting unit corresponds to a first one of the electrode pad groups in the first one of the pixel areas. The substitute light-emitting unit includes a first electrode and a second electrode. The first electrode of the substitute light-emitting unit is electrically connected to the first electrode pad of the first one of the electrode pad groups. The second electrode of the substitute light-emitting unit is electrically connected to the third electrode pad of the first one of the electrode pad groups.

In some embodiments, a residual conductive material exists on the first electrode pad connected to the first electrode of the substitute light-emitting unit.

In some embodiments, the light-emitting panel further includes a first light-emitting unit disposed on one of the first electrode pad and the second electrode pad of the first one of the electrode pad groups. The first light-emitting unit emits light of a same color as light emitted by the substitute light-emitting unit. The first light-emitting unit is electrically disconnected from the other of the first electrode pad and the second electrode pad of the first one of the electrode pad groups.

In some embodiments, the light-emitting panel further includes an insulating layer laterally surrounding the light-emitting units. The insulating layer has an opening exposing the third electrode pad of the first one of the electrode pad groups. The insulating layer covers the third electrode pads of the rest of the electrode pad groups.

In some embodiments, the opening further exposes the first electrode pad of the first one of the electrode pad groups and is configured to accommodate the substitute light-emitting unit.

In some embodiments, the opening further exposes the first electrode pad and the second electrode pad of the first one of the electrode pad groups and is configured to accommodate the substitute light-emitting unit.

In some embodiments, the insulating layer has another opening so as to expose the first electrode pad of the first one of the electrode pad groups and accommodate the substitute light-emitting unit.

In some embodiments, the first electrode pad has a contact surface. A width of the contact surface in the second direction is greater than a sum of half a width of the substitute light-emitting unit and a width of any one of the light-emitting units.

In some embodiments, the first electrode pad has a contact surface. A width of the contact surface in the second direction is greater than twice a width of the substitute light-emitting unit.

In some embodiments, the light-emitting units corresponding to the rest of the electrode pad groups in the first one of the pixel areas emit light of a different color from light emitted by the substitute light-emitting unit.

In some embodiments, the first electrode pad of the first one of the electrode pad groups has a bonding area and a substitute bonding area. The substitute light-emitting unit is disposed in the substitute bonding area.

In some embodiments, the light-emitting panel further includes a second light-emitting unit disposed on the first electrode pad of the first one of the electrode pad groups. The second light-emitting unit emits light of a same color as light emitted by the substitute light-emitting unit. The second light-emitting unit is disposed in the bonding area of the first electrode pad.

In some embodiments, the light-emitting panel further includes an insulating layer laterally surrounding the light-emitting units and covering the third electrode pad of each of the electrode pad groups.

In some embodiments, each of the light-emitting units is disposed above the first electrode pad of the corresponding one of the electrode pad groups.

In some embodiments, each of the light-emitting units is disposed above the second electrode pad of the corresponding one of the electrode pad groups.

Accordingly, in the circuit board and the light-emitting panel with the circuit board of some embodiments of the present disclosure, by disposing the substitute electrode pad in the direction along which the electrode pads electrically connected to the light-emitting unit are aligned, the electrode pads and the substitute electrode pad may be arranged more densely. Therefore, the light-emitting panel can have a higher pixel density while retaining space for repair. In addition, an insulating layer is disposed to cover the substitute electrode pad during mass transfers. An opening for exposing the substitute electrode pad is formed only during repair. This can prevent contamination of the substitute electrode pad during the mass transfers and bonding processes of the light-emitting unit. Therefore, the circuit board and the light-emitting panel with the circuit board in some embodiments of the present disclosure can effectively improve the success rate of repair.

It is to be understood that both the foregoing general description and the following detailed description are by examples and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 1 is a partial top view of a circuit board according to some embodiments of the present disclosure;

FIG. 2 is a partial top view of a light-emitting panel according to some embodiments of the present disclosure;

FIG. 4 is a partial top view of a light-emitting panel according to some embodiments of the present disclosure;

FIG. 6 is a partial top view of a light-emitting panel according to some embodiments of the present disclosure;

FIG. 8 is a partial top view of a circuit board according to some embodiments of the present disclosure;

FIG. 9 is a partial top view of a circuit board according to some embodiments of the present disclosure;

FIG. 10 is a partial top view of a light-emitting panel according to some embodiments of the present disclosure;

FIG. 12 is a partial top view of a light-emitting panel according to some embodiments of the present disclosure;

FIG. 13 is a partial top view of a light-emitting panel according to some embodiments of the present disclosure;

FIG. 15 is a partial top view of a light-emitting panel according to some embodiments of the present disclosure;

FIG. 19 is a partial top view of a light-emitting panel according to some embodiments of the present disclosure;

FIG. 21 is a partial top view of a light-emitting panel according to some embodiments of the present disclosure;

FIG. 23 is a partial cross-sectional view of a light-emitting panel along a line 23 in FIG. 22 according to some embodiments of the present disclosure;

FIG. 25 is a partial top view of a light-emitting panel according to some embodiments of the present disclosure;

FIG. 27 is a partial top view of a light-emitting panel according to some embodiments of the present disclosure.

DETAILED DESCRIPTION

Figure 3:
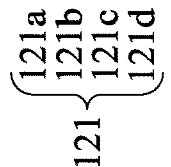
FIG. 3 is a partial cross-sectional view of a light-emitting panel along a line 3 in FIG. 2 according to some embodiments of the present disclosure.
Figure 3:
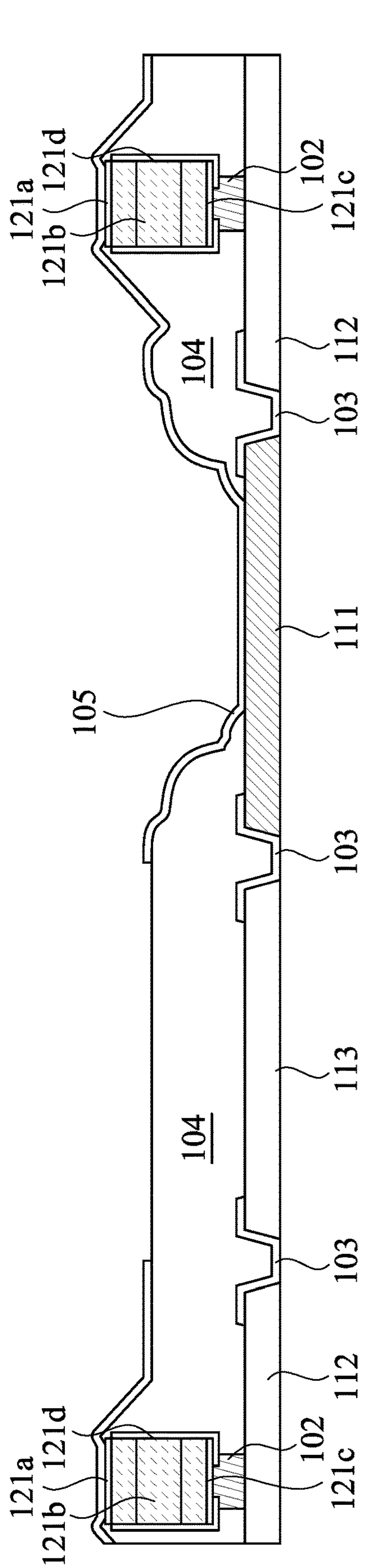

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a partial top view of a circuit board 100 according to some embodiments of the present disclosure. The circuit board 100 includes a substrate (not shown) and a plurality of pixel areas. For example, as shown in FIG. 1, the circuit board 100 has a pixel area P1, a pixel area P2, and a part of the pixel area P3 on the substrate.

In the figures, the top views partially show the circuit boards and the light-emitting panels for convenience. It should be understood that the parts depicted in the figures may extend in a first direction D1 and a second direction D2 and be arranged periodically to form a whole. For example, a plurality of pixel areas that are similar to the pixel area P1, the pixel area P2, and the pixel area P3 form a pixel array distributed in the first direction D1 and the second direction D2 on the substrate.

Each pixel area includes a plurality of electrode pad groups 110. For example, as shown in FIG. 1, the pixel area P1 includes an electrode pad group 110*a*, an electrode pad group 110*b*, and an electrode pad group 110*c*. The electrode pad groups 110 are arranged in the first direction D1. For example, as shown in FIG. 1, they are arranged from left to right.

Each electrode pad group 110 includes a first electrode pad 111, a second electrode pad 112, and a third electrode pad 113. The first electrode pads 111, the second electrode pads 112, and the third electrode pads 113 are arranged in the second direction D2. The second direction D2 is different from the first direction D1. For example, as shown in FIG. 1, the second direction D2 is perpendicular to the first direction D1. It should be noted that, as shown in FIG. 1, the first electrode pad 111 is disposed between the second electrode pad 112 and the third electrode pad 113.

In some embodiments, to ensure insulation between the electrode pads, the circuit board 100 further includes a protective layer 103. The protective layer 103 covers the substrate and laterally surrounds the first electrode pad 111, the second electrode pad 112, and the third electrode pad 113 (referring to the cross-sectional view in FIG. 3). The first electrode pad 111, the second electrode pad 112, and the third electrode pad 113 have contact surfaces exposed through the protective layer 103. It should be noted that the blocks representing the first electrode pad 111, the second electrode pad 112, and the third electrode pad 113 in the top view of FIG. 1 and subsequent figures are the contact surfaces exposed through the protective layer 103.

The first electrode pad 111 is configured to provide a first voltage potential. The second electrode pad 112 and the third electrode pad 113 are configured to provide a second voltage potential. The first voltage potential and the second voltage potential are different.

Reference is made to FIG. 2. FIG. 2 is a partial top view of a light-emitting panel 10A according to some embodiments of the present disclosure. As shown in FIG. 2, the light-emitting panel 10A includes a circuit board 100 and a plurality of light-emitting units 120, such as the light-emitting unit 121, the light-emitting unit 122, and the light-emitting unit 123 disposed in the pixel area P2. As shown in FIG. 2, the light-emitting unit 121, the light-emitting unit 122, and the light-emitting unit 123 are arranged in the first direction D1.

As shown in FIG. 2, each light-emitting unit 120 corresponds to an electrode pad group 110. Therefore, there are three light-emitting units 120 disposed in the pixel area P2. In some embodiments, the light-emitting unit 121, the light-emitting unit 122, and the light-emitting unit 123 correspond to red light, green light, and blue light, respectively.

In some embodiments, as shown in FIG. 2, the light-emitting unit 120 is disposed on the second electrode pad 112 and is electrically connected to the first electrode pad 111 through the transparent conductive layer 105. In some embodiments, to avoid unstable connection of the transparent conductive layer 105 due to the height difference between the light-emitting unit 121 and the substrate, the light-emitting panel 10A further includes a second insulating layer laterally surrounding the light-emitting unit 121. However, the second insulating layer is not shown in FIG. 2 and subsequent top views for clarity.

Reference is made to FIG. 3. FIG. 3 is a partial cross-sectional view along a line 3 in FIG. 2 of the light-emitting panel 10A according to some embodiments of the present disclosure. As shown in FIG. 3, the light-emitting panel 10A includes a first electrode pad 111, a second electrode pad 112, and a third electrode pad 113. The light-emitting panel 10A further includes a protective layer 103. As aforementioned, the protective layer 103 covers the substrate (not shown) and laterally surrounds the first electrode pad 111, the second electrode pad 112, and the third electrode pad 113. As shown in FIG. 3, the first electrode pad 111, the second electrode pad 112, and the third electrode pad 113 have contact surfaces exposed through the protective layer 103.

The light-emitting panel 10A further includes a light-emitting unit 121. As shown in FIG. 3, the light-emitting unit 121 includes a first electrode 121*a*, a semiconductor stacked structure 121*b*, a second electrode 121*c*, and a first insulating layer 121*d*. As shown in FIG. 3, the light-emitting unit 121 is disposed on the second electrode pad 112. To be more specific, the light-emitting unit 121 is disposed on the second electrode pad 112 through the second electrode 121*c* and is electrically connected to the second electrode pad 112.

In some embodiments, there are solder layers 102 between the second electrode 121*c* and the second electrode pad 112 or an intermetallic compound (IMC) generated when the second electrode 121*c* and the second electrode pad 112 are joined, as shown in FIG. 3.

In some embodiments, the semiconductor stacked structure 121*b* includes a first semiconductor layer, a second semiconductor layer, and a light-emitting layer. The light-emitting layer is disposed between the first semiconductor layer and the second semiconductor layer. The first electrode 121*a* of the light-emitting unit 121 is connected to the first semiconductor layer of the semiconductor stacked structure 121*b*. The second electrode 121*c* is connected to the second semiconductor layer of the semiconductor stacked structure 121*b*. In some embodiments, the first semiconductor layer is a p-type semiconductor layer. The second semiconductor layer is an n-type semiconductor layer. The light-emitting units in the subsequent figures all have similar structures as the light-emitting unit 121.

The light-emitting panel 10A further includes a transparent conductive layer 105. As shown in FIG. 3, the first electrode 121*a* of the light-emitting unit 121 is electrically connected to the first electrode pad 111 through the transparent conductive layer 105.

In some embodiments, to avoid unstable connection of the transparent conductive layer 105 due to the height difference between the light-emitting unit 121 and the substrate, the light-emitting panel 10A further includes a second insulating layer 104. As shown in FIG. 3, the second insulating layer 104 laterally surrounds the light-emitting units such as the light-emitting unit 121. In some embodiments, the second insulating layer 104 covers the second electrode pad 112 and the third electrode pad 113 and exposes a portion of a contact surface of the first electrode pad 111. As such, the transparent conductive layer 105 can contact and be electrically connected to the first electrode pad 111. In the embodiments of the light-emitting panel 10A, the third electrode pad 113 is dummy and completely covered by the second insulating layer 104.

In some embodiments, the light-emitting unit 120 fails, so the faulty light-emitting unit is removed during repair. Then, the substitute electrode pad, such as the third electrode pad 113, is exposed and a functioning light-emitting unit is disposed on the substitute electrode pad in a flip-chip manner.

In this way, the substitute electrode pad is only exposed when needed for repair. Thus, the substitute electrode pad can be prevented from being contaminated, oxidized, or corroded during the mass transfers and bonding processes of the previously disposed light-emitting units. Thereby, the success rate for repair may be improved.

For example, reference is made to FIG. 4. FIG. 4 is a partial top view of a light-emitting panel 10B according to some embodiments of the present disclosure. The difference between the light-emitting panel 10B and the light-emitting panel 10A is that, as shown in FIG. 4, the light-emitting panel 10B further includes a substitute light-emitting unit 130 and does not include the light-emitting unit 121 of the light-emitting panel 10A. The substitute light-emitting unit 130 corresponds to the electrode pad group 110*d* in the pixel area P2. As shown in FIG. 4, the substitute light-emitting unit 130 is disposed on the first electrode pad 111 and the third electrode pad 113 of the electrode pad group 110*d*.

Figure 5:
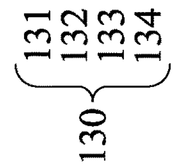
FIG. 5 is a partial cross-sectional view of a light-emitting panel along a line 5 in FIG. 4 according to some embodiments of the present disclosure.
Figure 5:
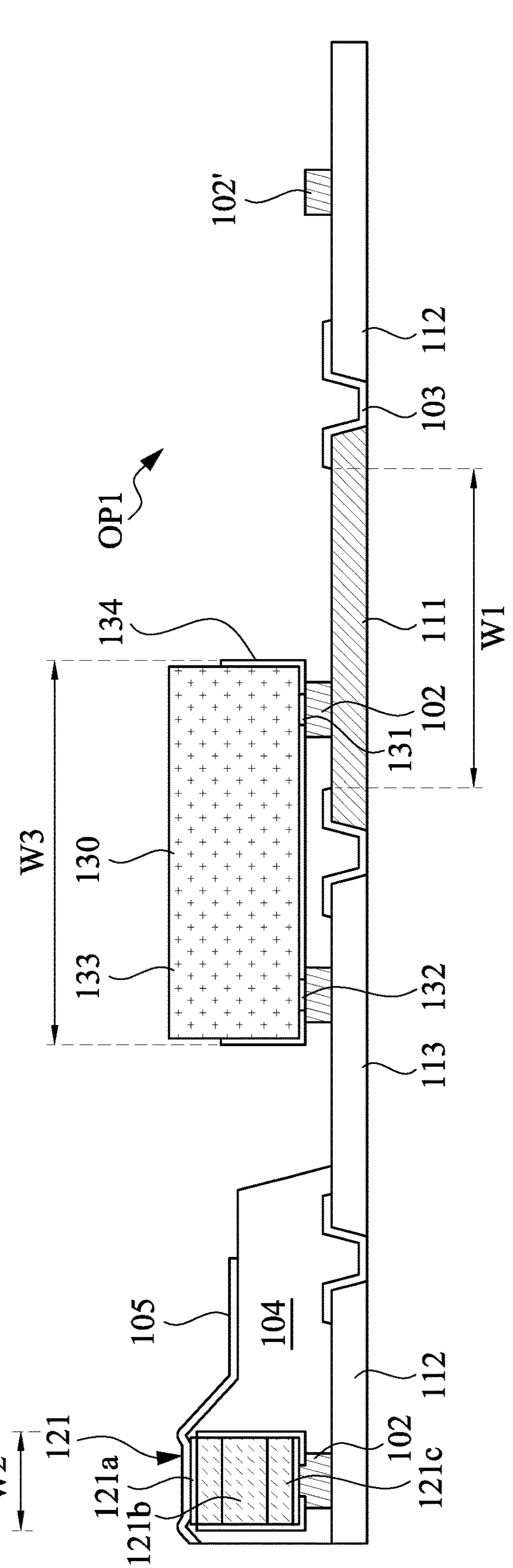

Reference is made to FIG. 5. FIG. 5 is a partial cross-sectional view of the light-emitting panel 10B along a line 5 in FIG. 4 according to some embodiments of the present disclosure. As shown in FIG. 5, the light-emitting panel 10B includes a substitute light-emitting unit 130 and does not include the light-emitting unit 121 of the light-emitting panel 10A. The substitute light-emitting unit 130 includes a first electrode 131, a second electrode 132, a semiconductor stacked structure 133, and a third insulating layer 134. The first electrode 131 of the substitute light-emitting unit 130 is electrically connected to the first electrode pad 111. The second electrode 132 of the substitute light-emitting unit 130 is electrically connected to the third electrode pad 113. In some embodiments, there are solder layers 102 or intermetallic compounds between the first electrode 131 and the first electrode pad 111 and between the second electrode 132 and the third electrode pad 113.

In some embodiments, during the process of removing the faulty light-emitting unit 120, the solder layer 102 (referring to FIG. 3) or the intermetallic compound of the faulty light-emitting unit 120 (e.g., the light-emitting unit 121 on the right side of FIG. 3) is not completely removed. Thus, there may be a residual solder layer 102', intermetallic compounds, and other conductive materials on the second electrode pad 112, as shown in FIG. 4 and FIG. 5.

As shown in FIG. 5, different from the second insulating layer 104 of the light-emitting panel 10A, the second insulating layer 104 of the light-emitting panel 10B has an opening OP1. The opening OP1 exposes the first electrode pad 111, the second electrode pad 112, and the third electrode pad 113 of the electrode pad group 110*d* (referring to FIG. 4) through the second insulating layer 104. At the same time, the opening OP1 is configured to accommodate the substitute light-emitting unit 130.

In some embodiments, the substitute light-emitting unit 130 emits light of a different color from other light-emitting units in the pixel area P2 (i.e., the light-emitting unit 122 and the light-emitting unit 123 in FIG. 4). For example, when the light-emitting unit 122 and the light-emitting unit 123 correspond to green light and blue light, respectively, the substitute light-emitting unit 130 corresponds to red light.

In some embodiments, to dispose the substitute light-emitting unit 130 on the first electrode pad 111, a width W1 of the first electrode pad 111 is set to be greater than half a width W3 of the substitute light-emitting unit 130, as shown in FIG. 5.

In some embodiments, when some light-emitting units 120 are faulty, the step of removing the faulty light-emitting units 120 is omitted. The light-emitting units 120 are simply disconnected from the electrode pads. Then, the substitute electrode pads (such as the third electrode pad 113) are exposed and functioning light-emitting units are disposed on the substitute electrode pads, for example, in a flip-chip manner.

For example, reference is made to FIG. 6. FIG. 6 is a partial top view of a light-emitting panel 10C according to some embodiments of the present disclosure. The difference between the light-emitting panel 10C and the light-emitting panel 10B is that, as shown in FIG. 6, the light-emitting panel 10C further includes a faulty light-emitting unit 125 located on the second electrode pad 112, which means the faulty light-emitting unit 125 is not removed during repair. The substitute light-emitting unit 130 and the faulty light-emitting unit 125 emit light of the same color.

It should be noted that the faulty light-emitting unit 125 is electrically disconnected from the first electrode pad 111. For example, as shown in FIG. 6, the transparent conductive layer 105 is divided into a transparent conductive layer 105*a* and a transparent conductive layer 105*b* that are mutually disconnected through a laser process.

Figure 7:
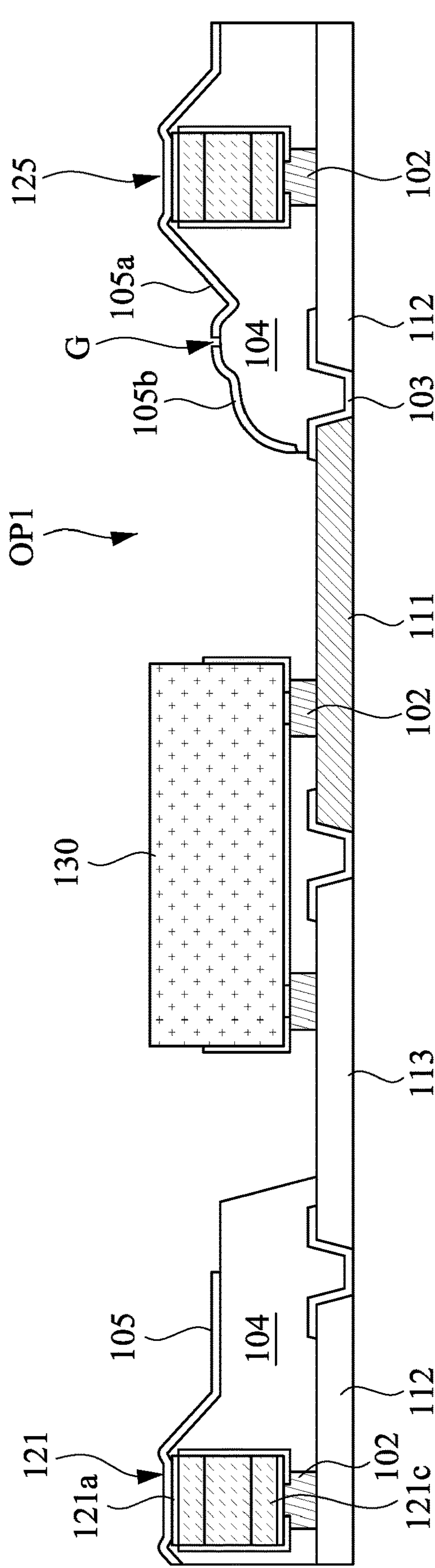
FIG. 7 is a partial cross-sectional view of a light-emitting panel along a line 7 in FIG. 6 according to some embodiments of the present disclosure.

Reference is made to FIG. 7. FIG. 7 is a partial cross-sectional view along a line 7 in FIG. 6 of the light-emitting panel 10C according to some embodiments of the present disclosure. As shown in FIG. 7, different from the light-emitting panel 10B, the light-emitting panel 10C further includes a faulty light-emitting unit 125, and the opening OP1 of the second insulating layer 104 of the light-emitting panel 10C only exposes the first electrode pad 111 and the third electrode pad 113. The opening OP1 is configured to accommodate the substitute light-emitting unit 130. In addition, as aforementioned, the light-emitting panel 10C further includes a transparent conductive layer 105*a* and a transparent conductive layer 105*b* separated by a gap G.

Reference is made to FIG. 8. FIG. 8 is a partial top view of a circuit board 200 according to some embodiments of the present disclosure. The difference between the circuit board 200 and the circuit board 100 is that, as shown in FIG. 8, in some embodiments, every second electrode pad 212 of the pixel area P1 and every third electrode pad 213 of the pixel area P2 of the circuit board 200 form a continuous structure. Meanwhile, as shown in FIG. 8, in some embodiments, the second electrode pads 212 of every electrode pad group 210 in the pixel area P1 form a continuous structure. As such, the second electrodes pads 212 in the pixel area P1 and the third electrode pads 213 in the pixel area P2 form a continuous structure on a whole, as shown in FIG. 8. This continuous structure is configured to provide a second voltage potential.

Reference is made to FIG. 9. FIG. 9 is a partial top view of a circuit board 300 according to some embodiments of the present disclosure. The circuit board 300 includes a pixel area P1 and a pixel area P2. The pixel area P1 and the pixel area P2 include a plurality of electrode pad groups 310. Each electrode pad group 310 includes a first electrode pad 311, a second electrode pad 312, and a third electrode pad 313.

The difference between the circuit board 300 and the circuit board 200 is that, as shown in FIG. 9, in some embodiments, the third electrode pads 313 of every electrode pad group 310 in the pixel area P1 of the circuit board 300 form a continuous structure. In this way, the second electrode pads 312 of the pixel area P1 and the third electrode pads 313 of the pixel area P2 form a continuous structure, as shown in FIG. 9. This continuous structure is configured to provide a second voltage potential. For convenience, in the following paragraphs and figures, components of the circuit board 300 that are similar to components of the circuit board 200 are numbered with the same numbers of the corresponding components of the circuit board 200. Similarly, in the embodiments of the light-emitting panels with the circuit board 300 (such as the light-emitting panel 30A to the light-emitting panel 30F in the following paragraphs), components similar to components of the light-emitting panels with the circuit board 200 (such as the light-emitting panel 20A to the light-emitting panel 20F in the following paragraphs) are numbered with the same numbers of the corresponding components.

As shown in FIG. 9, similar to the circuit board 200, the circuit board 300 further includes a protective layer 203.

Reference is made to FIG. 10. FIG. 10 is a partial top view of a light-emitting panel 20A according to some embodiments of the present disclosure. As shown in FIG. 10, the light-emitting panel 20A includes a circuit board 200 and a plurality of light-emitting units 220, such as the light-emitting unit 221, the light-emitting unit 222, and the light-emitting unit 223 disposed in the pixel area P2. As shown in FIG. 10, the light-emitting unit 220 is disposed on the first electrode pad 211.

Figure 11:
FIG. 11 is a partial cross-sectional view of a light-emitting panel along a line 11 in FIG. 10 according to some embodiments of the present disclosure.
Figure 11:
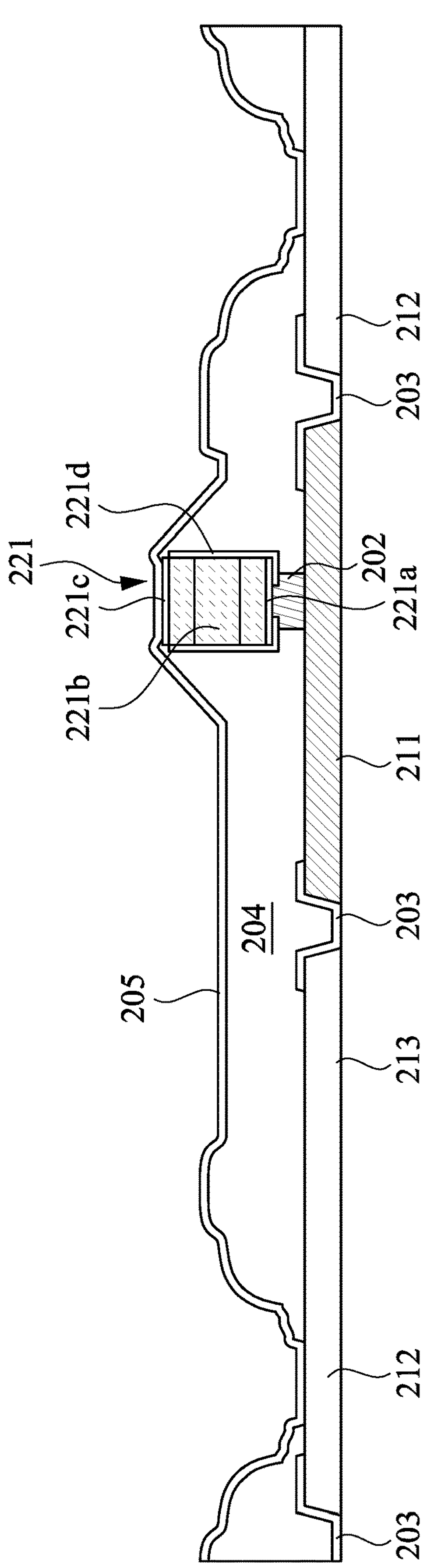

Reference is made to FIG. 11. FIG. 11 is a partial cross-sectional view of the light-emitting panel 20A along a line 11 in FIG. 10 according to some embodiments of the present disclosure. As shown in FIG. 11, the light-emitting panel 20A includes a first electrode pad 211, a second electrode pad 212, and a third electrode pad 213. The light-emitting panel 20A further includes a protective layer 203. The protective layer 203 covers the substrate (not shown) and laterally surrounds the first electrode pad 211, the second electrode pad 212, and the third electrode pad 213. As shown in FIG. 11, the first electrode pad 211, the second electrode pad 212, and the third electrode pad 213 have contact surfaces exposed through the protective layer 203.

The light-emitting panel 20A further includes a light-emitting unit 221. As shown in FIG. 11, the light-emitting unit 221 is disposed on the first electrode pad 211. To be more specific, the light-emitting unit 221 is disposed on the first electrode pad 211 through the first electrode 221*a* and is electrically connected to the first electrode pad 211. In some embodiments, there are solder layers 202 or intermetallic compounds between the first electrode 221*a* and the first electrode pad 211.

As shown in FIG. 11, the light-emitting unit 221 includes a first electrode 221*a*, a semiconductor stacked structure 221*b*, a second electrode 221*c*, and a first insulating layer 221*d*.

The light-emitting panel 20A further includes a transparent conductive layer 205. As shown in FIG. 11, the second electrode 221*c* of the light-emitting unit 221 is electrically connected to the second electrode pad 212 through the transparent conductive layer 205.

In some embodiments, to avoid unstable connection of the transparent conductive layer 205 due to the height difference between the light-emitting unit 221 and the substrate, the light-emitting panel 20A further includes a second insulating layer 204. As shown in FIG. 11, the second insulating layer 204 laterally surrounds the light-emitting units such as the light-emitting unit 221. In some embodiments, the second insulating layer 204 covers the first electrode pad 211 and the third electrode pad 213 and exposes a part of the second electrode pad 212 so that the transparent conductive layer 205 can contact and be electrically connected with the second electrode pad 212.

Reference is made to FIG. 12. FIG. 12 is a partial top view of a light-emitting panel 30A according to some embodiments of the present disclosure. The difference between the light-emitting panel 30A and the light-emitting panel 20A is that, as shown in FIG. 12, the light-emitting panel 30A includes a circuit board 300. The light-emitting panel 30A has the same structure as the light-emitting panel 20A in a cross-sectional view along a line corresponding to the line 11 of the light-emitting panel 20A.

Similar to the aforementioned, in some embodiments, the faulty light-emitting units 220 are removed, the substitute electrode pads, such as the third electrode pad 213, are exposed, and functioning light-emitting units are disposed, for example, in a flip-chip manner on the substitute electrode pads.

For example, reference is made to FIG. 13. FIG. 13 is a partial top view of a light-emitting panel 20B according to some embodiments of the present disclosure. The difference between the light-emitting panel 20B and the light-emitting panel 20A is that, as shown in FIG. 13, the light-emitting panel 20B includes a substitute light-emitting unit 230 and does not include the light-emitting unit 221 of the light-emitting panel 20A. As shown in FIG. 13, the substitute light-emitting unit 230 is disposed on the first electrode pad 211 and the third electrode pad 213.

Figure 14:
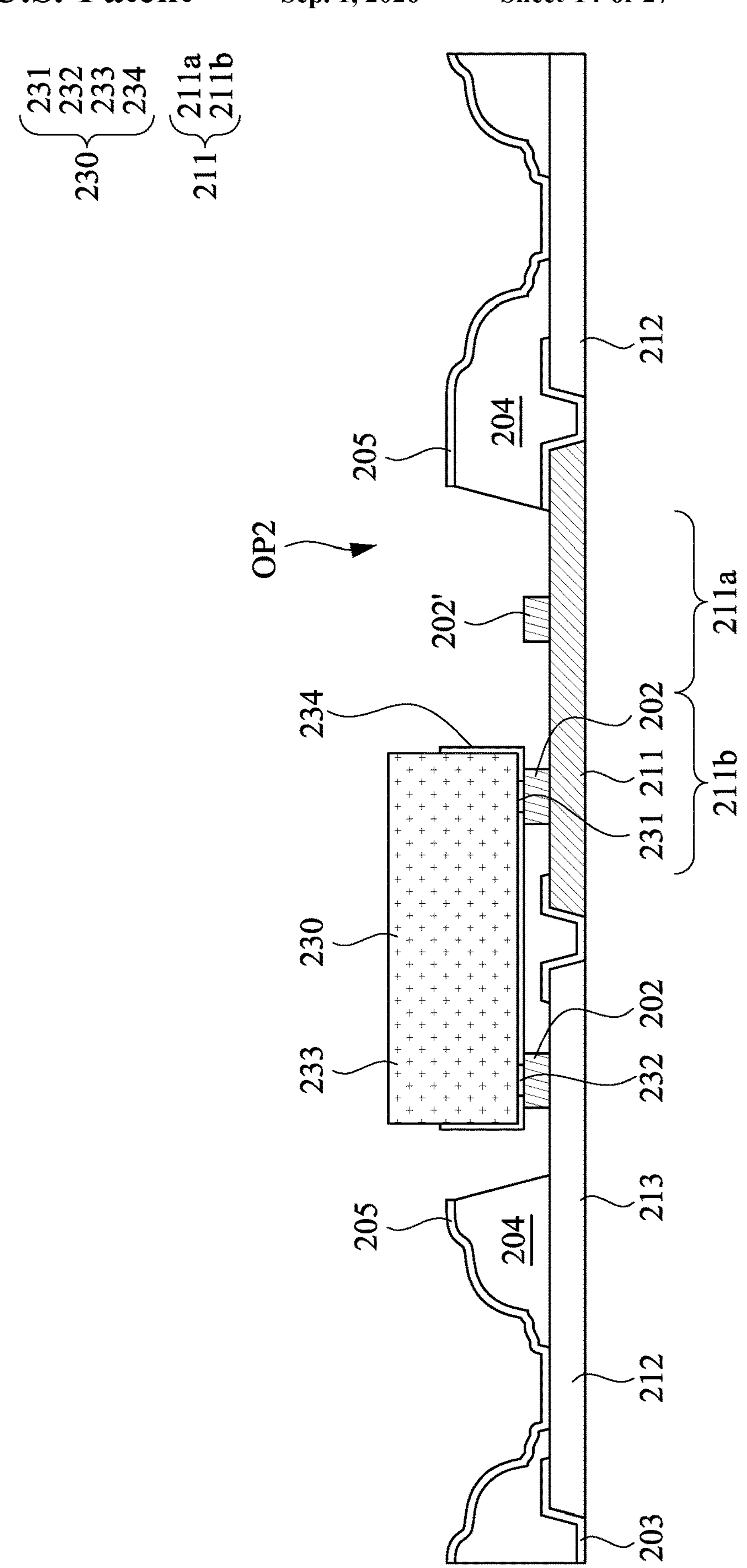
FIG. 14 is a partial cross-sectional view of a light-emitting panel along a line 14 in FIG. 13 according to some embodiments of the present disclosure.

Reference is made to FIG. 14. FIG. 14 is a partial cross-sectional view of the light-emitting panel 20B along a line 14 in FIG. 13 according to some embodiments of the present disclosure. In some embodiments, as shown in FIG. 14, the first electrode pad 211 can be divided into a bonding area 211*a* and a substitute bonding area 211*b*. The bonding area 211*a* is the position where the faulty light-emitting unit 220 was originally disposed. The substitute bonding area 211*b* is the position where the substitute light-emitting unit 230 is disposed during repair.

As shown in FIG. 14, the light-emitting panel 20B includes a substitute light-emitting unit 230 and does not include the light-emitting unit 221 of the light-emitting panel 20A. The substitute light-emitting unit 230 includes a first electrode 231, a second electrode 232, a semiconductor stacked structure 233, and a third insulating layer 234. The first electrode 231 of the substitute light-emitting unit 230 is electrically connected to the substitute bonding area 211*b* of the first electrode pad 211. The second electrode 232 of the substitute light-emitting unit 230 is electrically connected to the third electrode pad 213. In some embodiments, there are solder layers 202 or intermetallic compounds between the first electrode 231 and the first electrode pad 211 and between the second electrode 232 and the third electrode pad 213.

In some embodiments, there are a residual solder layer 202', an intermetallic compound, and other conductive materials on the first electrode pad 211, as shown in FIG. 13 and FIG. 14.

As shown in FIG. 14, different from the second insulating layer 204 of the light-emitting panel 20A, the second insulating layer 204 of the light-emitting panel 20B has an opening OP2. The opening OP2 exposes the first electrode pad 211 and the third electrode pad 213 of the electrode pad group 210*d* (referring to FIG. 13) through the second insulating layer 204. At the same time, the opening OP2 is configured to accommodate the substitute light-emitting unit 230.

In some embodiments, the substitute light-emitting unit 230 emits light of a different color from light emitted by the other light-emitting units in the pixel area P2 (i.e., the light-emitting unit 222 and the light-emitting unit 223 in FIG. 13). For example, when the light-emitting unit 222 and the light-emitting unit 223 correspond to green light and blue light, respectively, the substitute light-emitting unit 230 corresponds to red light.

Reference is made to FIG. 15. FIG. 15 is a partial top view of a light-emitting panel 30B according to some embodiments of the present disclosure. The difference between the light-emitting panel 30B and the light-emitting panel 20B is that, as shown in FIG. 15, the light-emitting panel 30B includes a circuit board 300. The light-emitting panel 30B has the same structure as the light-emitting panel 20B in a cross-sectional view along a line corresponding to the line 14 of the light-emitting panel 20B.

As aforementioned, in some embodiments, when some light-emitting units 220 are faulty, the step of removing the faulty light-emitting units 220 is omitted. The light-emitting units 220 are simply disconnected from the electrode pads. Then, the substitute electrode pads (such as the third electrode pad 213) are exposed and functioning light-emitting units are disposed on the substitute electrode pads, for example, in a flip-chip manner.

Figure 16:
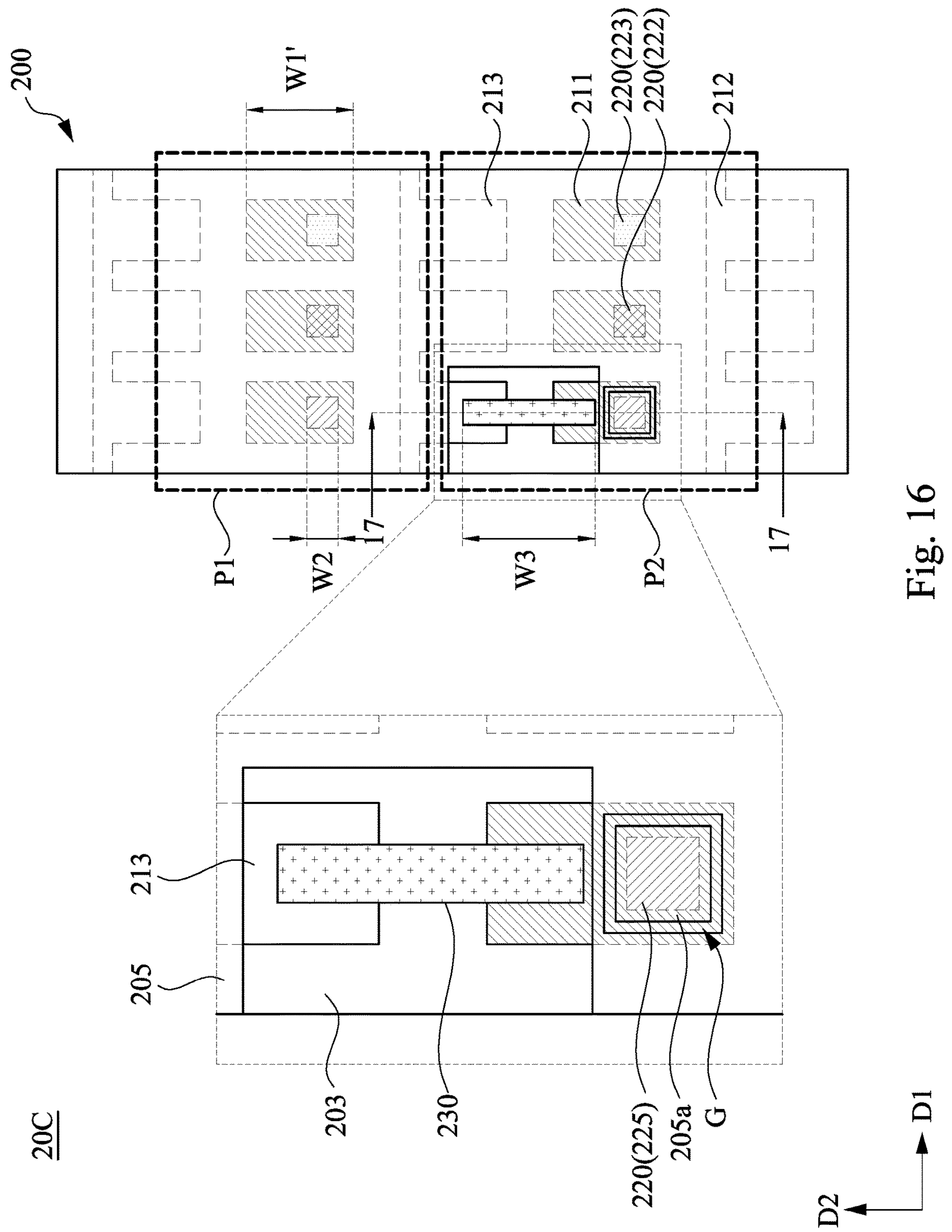
FIG. 16 is a partial top view of a light-emitting panel according to some embodiments of the present disclosure.

For example, reference is made to FIG. 16. FIG. 16 is a partial top view of a light-emitting panel 20C according to some embodiments of the present disclosure. The difference between the light-emitting panel 20C and the light-emitting panel 20B is that, as shown in FIG. 16, the light-emitting panel 20C further includes a faulty light-emitting unit 225 located on the first electrode pad 211. The substitute light-emitting unit 230 and the faulty light-emitting unit 225 emit light of the same color.

It should be noted that the faulty light-emitting unit 225 is electrically disconnected from the second electrode pad 212. For example, as shown in FIG. 16, a gap G is formed in the transparent conductive layer 205 through a laser process so that a portion (i.e., the transparent conductive layer 205*a*) of the transparent conductive layer 205 is separated from the rest of the transparent conductive layer 205, forming two conductive layers that are mutually disconnected.

Figure 17:
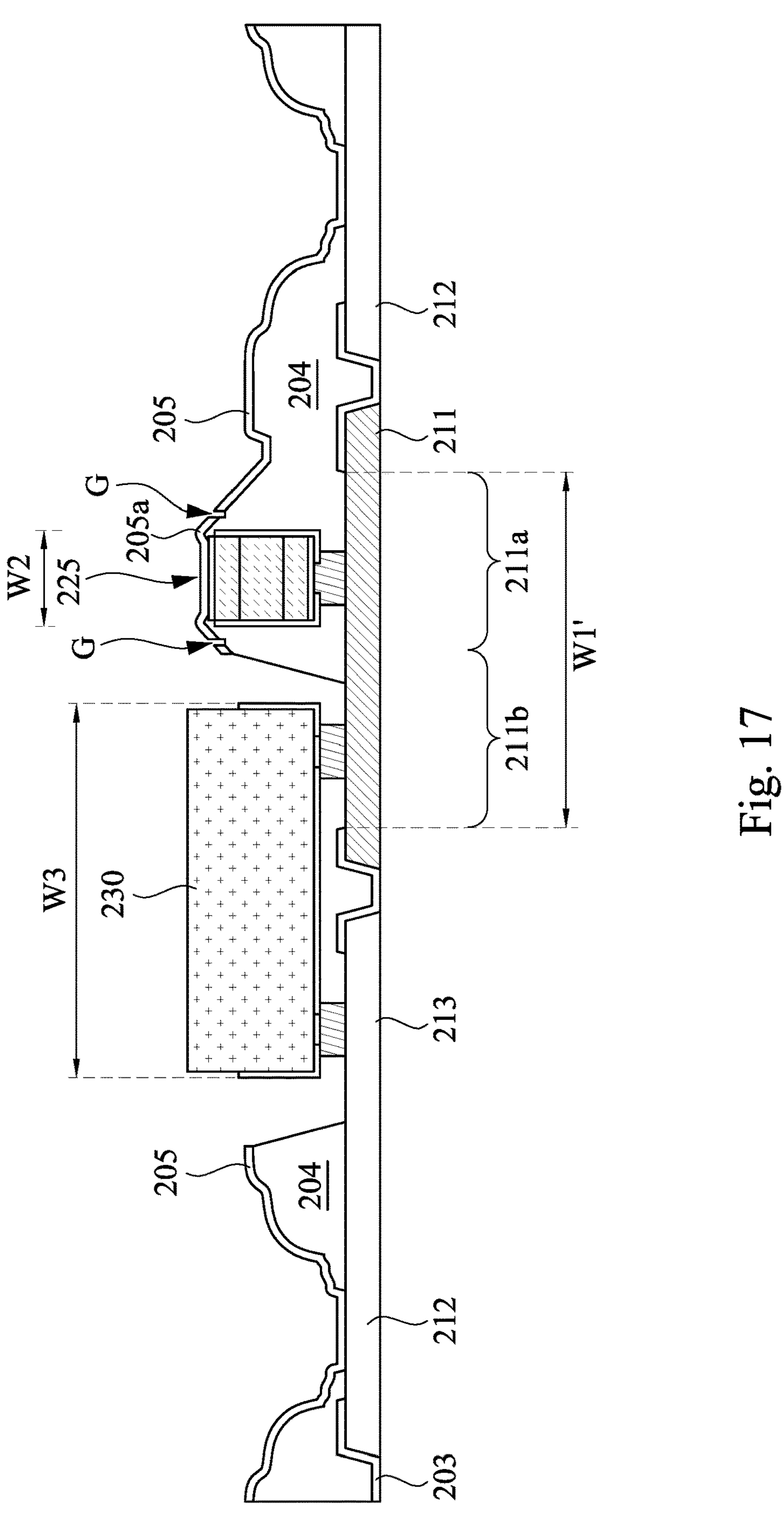
FIG. 17 is a partial cross-sectional view of a light-emitting panel along a line 17 in FIG. 16 according to some embodiments of the present disclosure.

Reference is made to FIG. 17. FIG. 17 is a partial cross-sectional view of the light-emitting panel 20C along a line 17 in FIG. 16 according to some embodiments of the present disclosure. As shown in FIG. 17, the light-emitting panel 20C includes a faulty light-emitting unit 225 disposed on the bonding area 211*a* of the first electrode pad 211. In addition, as aforementioned, the transparent conductive layer 205*a* of the transparent conductive layer 205 is separated from the rest of the transparent conductive layer 205 by a gap G.

In some embodiments, to dispose the substitute light-emitting unit 230 on the first electrode pad 211 and the third electrode pad 213, a width W1' of the first electrode pad 211 is set to be greater than a sum of half a width W3 of the substitute light-emitting unit 230 and a width W2 of the faulty light-emitting unit 225, as shown in FIG. 16 and FIG. 17.

Figure 18:
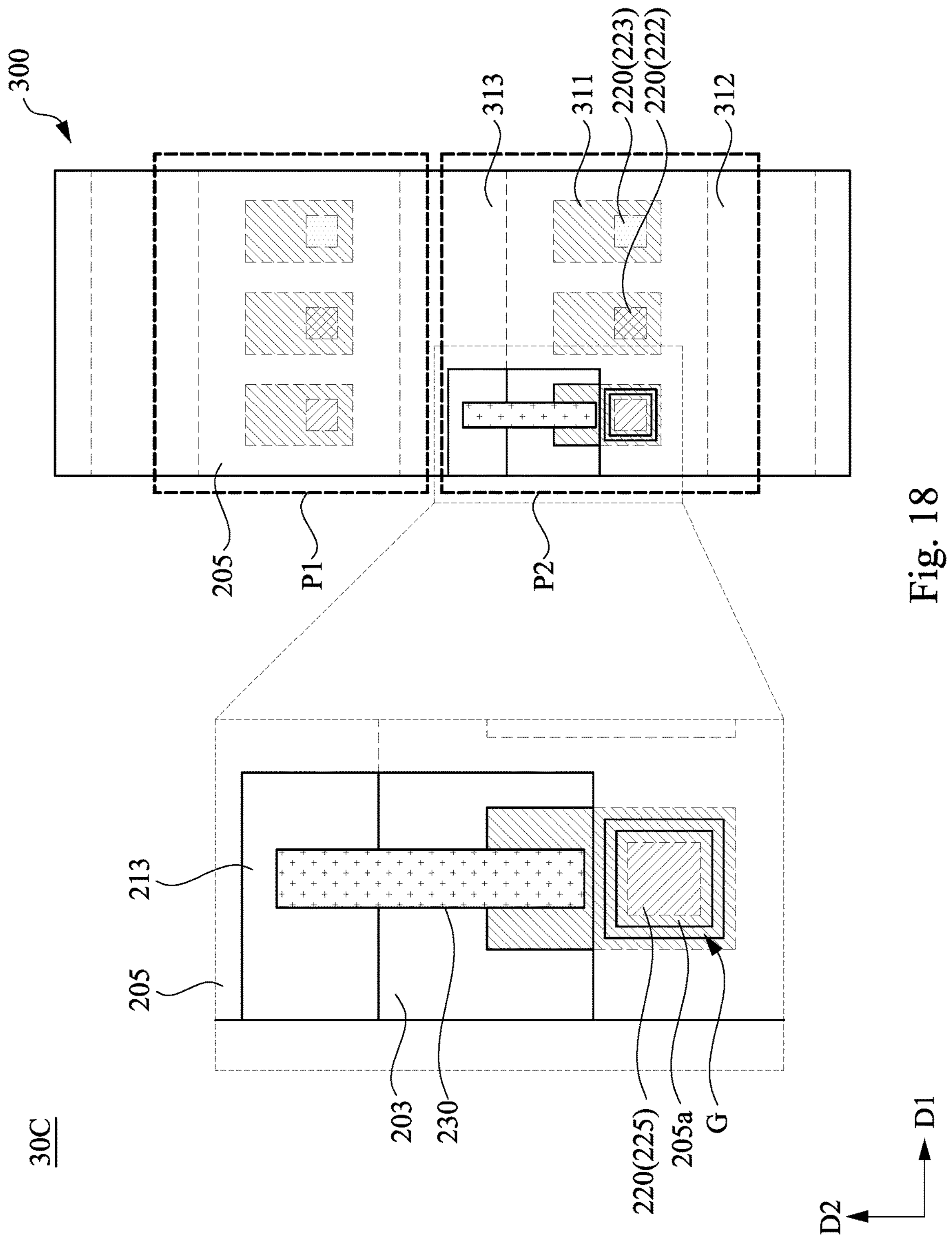
FIG. 18 is a partial top view of a light-emitting panel according to some embodiments of the present disclosure.

Reference is made to FIG. 18. FIG. 18 is a partial top view of a light-emitting panel 30C according to some embodiments of the present disclosure. The difference between the light-emitting panel 30C and the light-emitting panel 20C is that, as shown in FIG. 18, the light-emitting panel 30C includes a circuit board 300. The light-emitting panel 30C has the same structure as the light-emitting panel 20C in a cross-sectional view along a line corresponding to the line 17 of the light-emitting panel 20C.

In some embodiments, the faulty light-emitting units 220 are removed, the substitute electrode pads, such as the third electrode pad 213, are exposed, and some functioning light-emitting units that emit light of the same color as light emitted by the faulty light-emitting unit 220 is disposed on the substitute electrode pad for repair.

For example, after the faulty light-emitting unit 220 is removed, a substitute light-emitting unit 224 (referring to FIG. 19), which is a vertical light-emitting diode of the same type as the faulty light-emitting unit 220, is disposed on the first electrode pad 211. Then, the insulating material is filled back. Later, the substitute light-emitting unit 224 is electrically connected to the third electrode pad 213 through a transparent conductive material or a nanowire extending from the electrode of the substitute light-emitting unit 224 over the insulating material and the second insulating layer 204.

For example, reference is made to FIG. 19. FIG. 19 is a partial top view of a light-emitting panel 20D according to some embodiments of the present disclosure. As shown in FIG. 19, the difference between the light-emitting panel 20D and the light-emitting panel 20B is that the substitute light-emitting unit 224 of the light-emitting panel 20D is disposed on the first electrode pad 211. The light-emitting panel 20D further includes a fourth insulating layer 226 configured to laterally surround the substitute light-emitting unit 224. The light-emitting panel 20D further includes a wire 227 configured to electrically connect the substitute light-emitting unit 224 to the third electrode pad 213.

Figure 20:
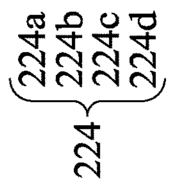
FIG. 20 is a partial cross-sectional view of a light-emitting panel along a line 20 in FIG. 19 according to some embodiments of the present disclosure.
Figure 20:
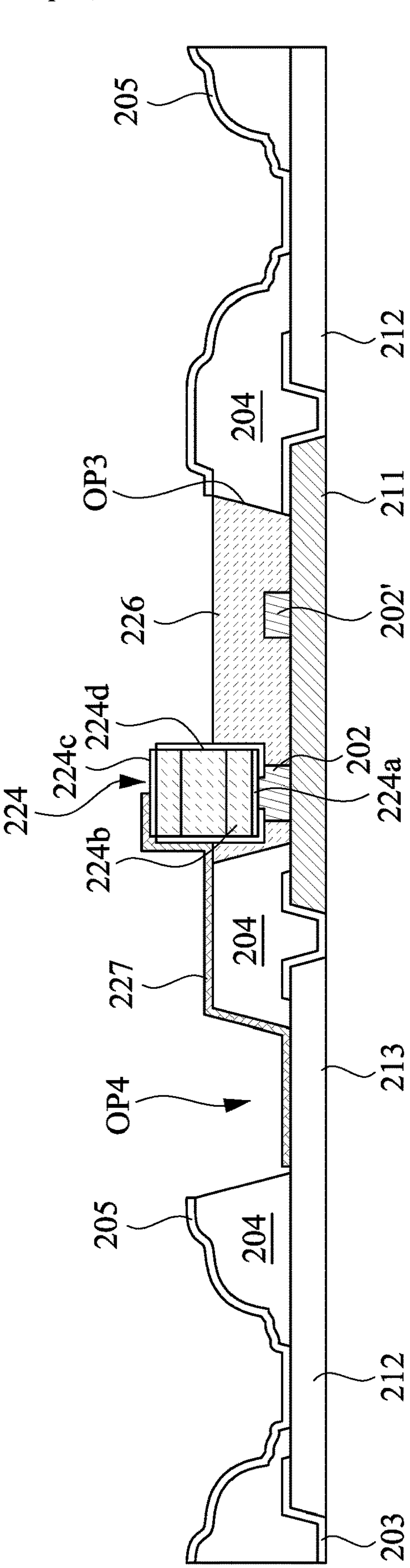

Reference is made to FIG. 20. FIG. 20 is a partial cross-sectional view of the light-emitting panel 20D along a line 20 in FIG. 19 according to some embodiments of the present disclosure. As shown in FIG. 20, the light-emitting panel 20D includes a substitute light-emitting unit 224 disposed on the first electrode pad 211. The substitute light-emitting unit 224 includes a first electrode 224*a*, a semiconductor stacked structure 224*b*, a second electrode 224*c*, and a first insulating layer 224*d*. The first electrode 224*a* of the substitute light-emitting unit 224 is electrically connected to the first electrode pad 211. The second electrode 224*c* of the substitute light-emitting unit 224 is electrically connected to the third electrode pad 213 through the wire 227. In some embodiments, there are solder layers 202 or intermetallic compounds between the first electrode 224*a* and the first electrode pad 211.

In some embodiments, there is a residual solder layer 202' on the first electrode pad 211, as shown in FIG. 19 and FIG. 20.

As shown in FIG. 20, different from the second insulating layer 204 of the light-emitting panel 20A, the second insulating layer 204 of the light-emitting panel 20D has an opening OP3 and an opening OP4. The opening OP3 exposes the first electrode pad 211 of the electrode pad group 210*d* (referring to FIG. 19) and is configured to accommodate the substitute light-emitting unit 224. The opening OP4 is configured to expose the third electrode pad 213 of the electrode pad group 210*d* so that the wire 227 can contact the third electrode pad 213 and form an electrical connection.

In some embodiments, the substitute light-emitting unit 224 emits light of a different color light from light emitted the other light-emitting units in the pixel area P2 (i.e., the light-emitting unit 222 and the light-emitting unit 223 in FIG. 19). For example, when the light-emitting unit 222 and the light-emitting unit 223 correspond to green light and blue light, respectively, the substitute light-emitting unit 224 corresponds to red light.

Reference is made to FIG. 21. FIG. 21 is a partial top view of a light-emitting panel 30D according to some embodiments of the present disclosure. The difference between the light-emitting panel 30D and the light-emitting panel 20D is that, as shown in FIG. 21, the light-emitting panel 30B includes a circuit board 300. The light-emitting panel 30D has the same structure as the light-emitting panel 20D in a cross-sectional view along a line corresponding to the line 20 of the light-emitting panel 20D.

In some embodiments, similar to the light-emitting panel 20C, when some light-emitting units 220 are faulty, the step of removing the faulty light-emitting units 220 is omitted. The light-emitting units 220 are simply disconnected from the electrode pads. Then, repair is performed by exposing the substitute electrode pads, such as the third electrode pad 213, and disposing some functioning light-emitting units that are of the same type as the faulty light-emitting units 220 on the substitute electrode pads. For example, a laser process is used to form a gap G in the transparent conductive layer 205 around a faulty light-emitting unit 225 so that the faulty light-emitting unit 225 is electrically disconnected from the second electrode pad 212. A substitute light-emitting unit 224 that is a vertical light-emitting diode of the same type as the faulty light-emitting unit 225 is disposed on the first electrode pad 211, and an insulating material is filled back. Then, the substitute light-emitting unit 224 is electrically connected to the third electrode pad 213 through a transparent conductive material or a nanowire extending from the electrode of the substitute light-emitting unit 224 over the insulating material and the second insulating layer 204.

Figure 22:
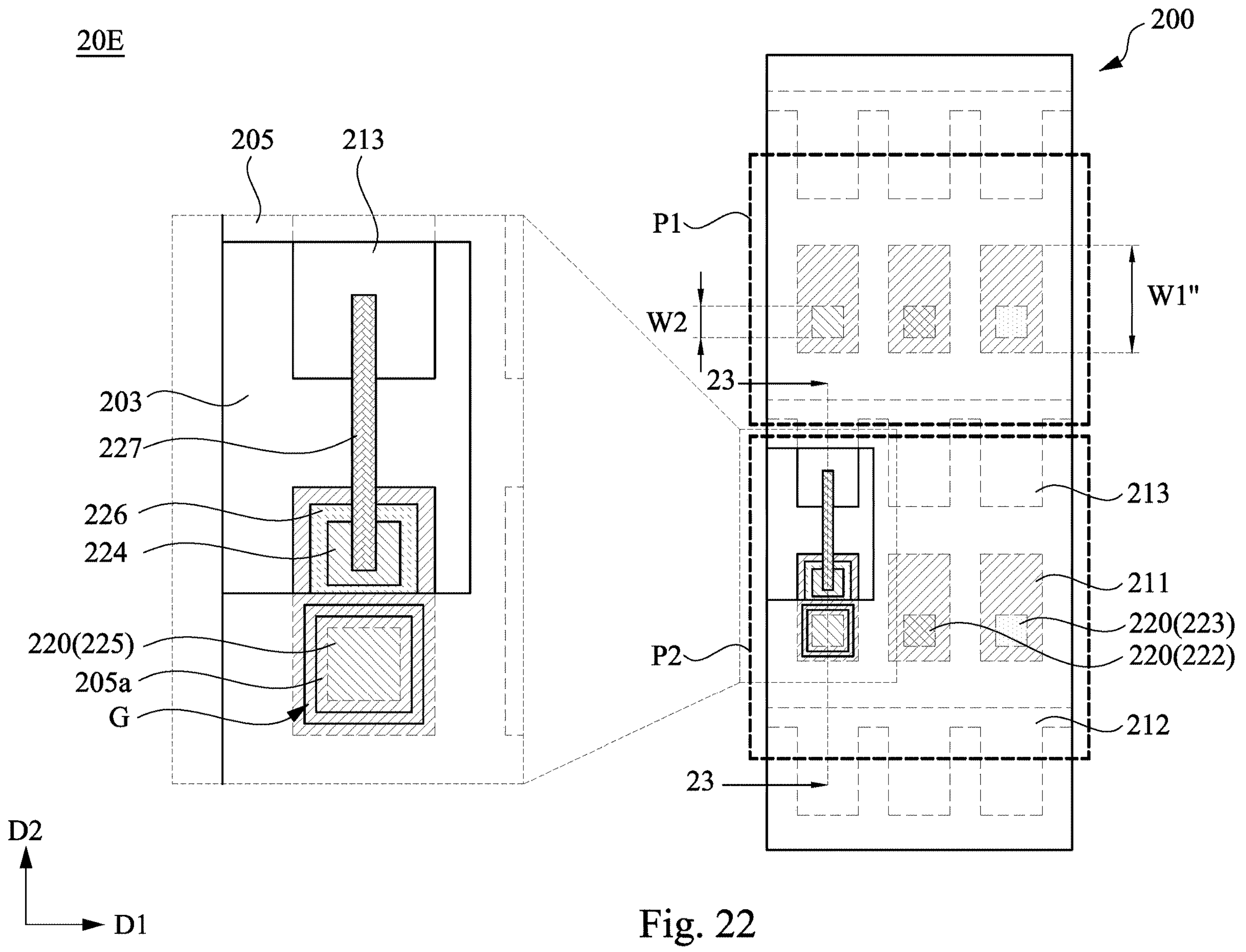
FIG. 22 is a partial top view of a light-emitting panel according to some embodiments of the present disclosure.

For example, reference is made to FIG. 22. FIG. 22 is a partial top view of a light-emitting panel 20E according to some embodiments of the present disclosure. The difference between the light-emitting panel 20E and the light-emitting panel 20D is that, as shown in FIG. 22, the light-emitting panel 20E further includes a faulty light-emitting unit 225 disposed on the first electrode pad 211, which means the faulty light-emitting unit 225 is not removed during repair. The substitute light-emitting unit 224 emits light of the same color as light emitted by the faulty light-emitting unit 225.

It should be noted that the faulty light-emitting unit 225 is electrically disconnected from the second electrode pad 212. For example, as shown in FIG. 22, a gap G is formed in the transparent conductive layer 205 so that a portion (i.e., the transparent conductive layer 205*a*) of the transparent conductive layer 205 is separated from the rest of the transparent conductive layer 205, forming two conductive layers that are mutually disconnected.

Figure 23:
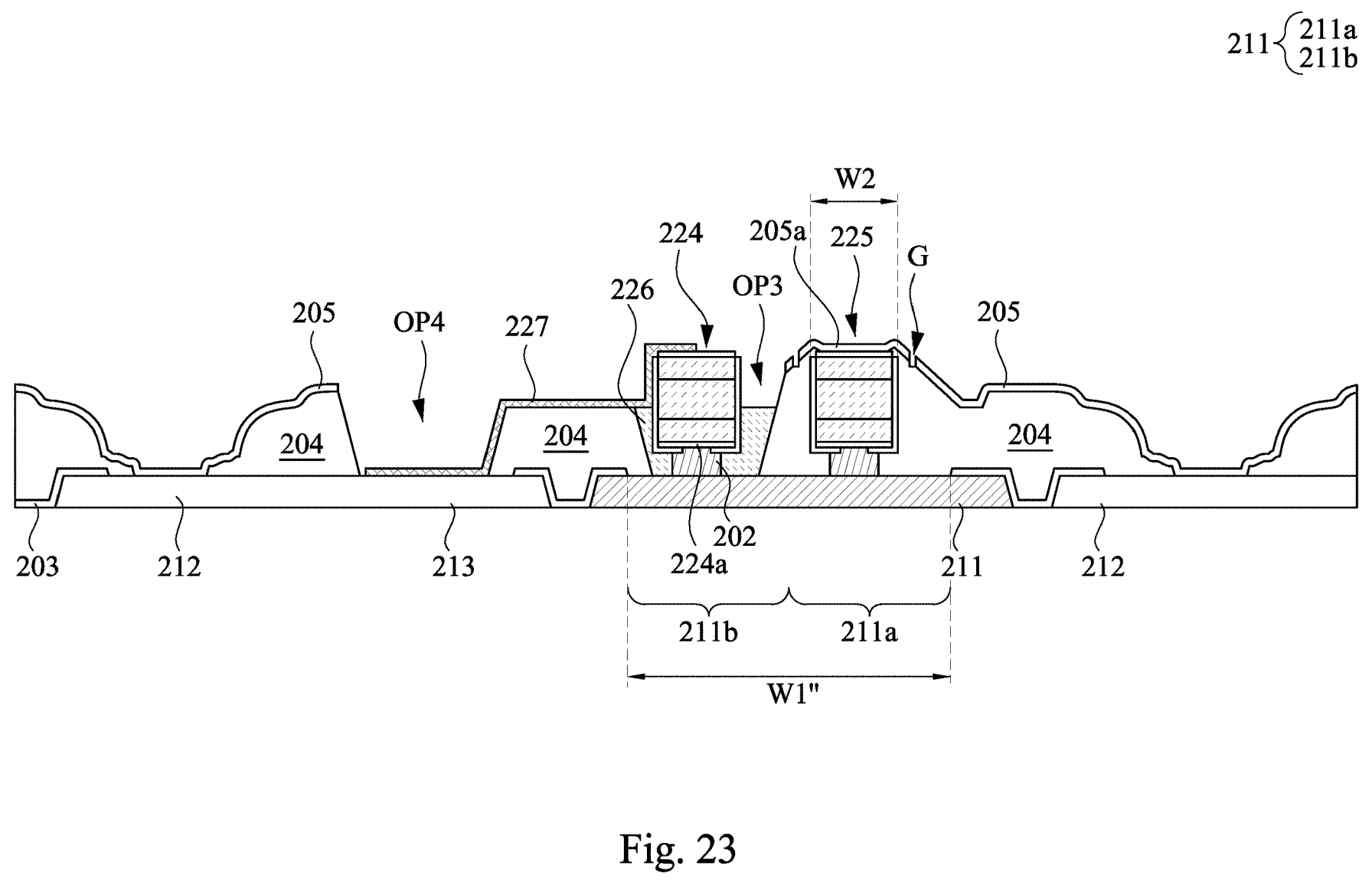

Reference is made to FIG. 23. FIG. 23 is a partial cross-sectional view of the light-emitting panel 20E along a line 23 in FIG. 22 according to some embodiments of the present disclosure. As shown in FIG. 23, the light-emitting panel 20E includes a faulty light-emitting unit 225 disposed on the bonding area 211*a* of the first electrode pad 211. In addition, as aforementioned, the transparent conductive layer 205*a* of the transparent conductive layer 205 is separated from the rest of the transparent conductive layer 205 by the gap G.

In some embodiments, to dispose the substitute light-emitting unit 224 on the first electrode pad 211, a width W1" of the first electrode pad 211 is set to be greater than twice a width W2 of the substitute light-emitting unit 224, as shown in FIG. 22 and FIG. 23.

Figure 24:
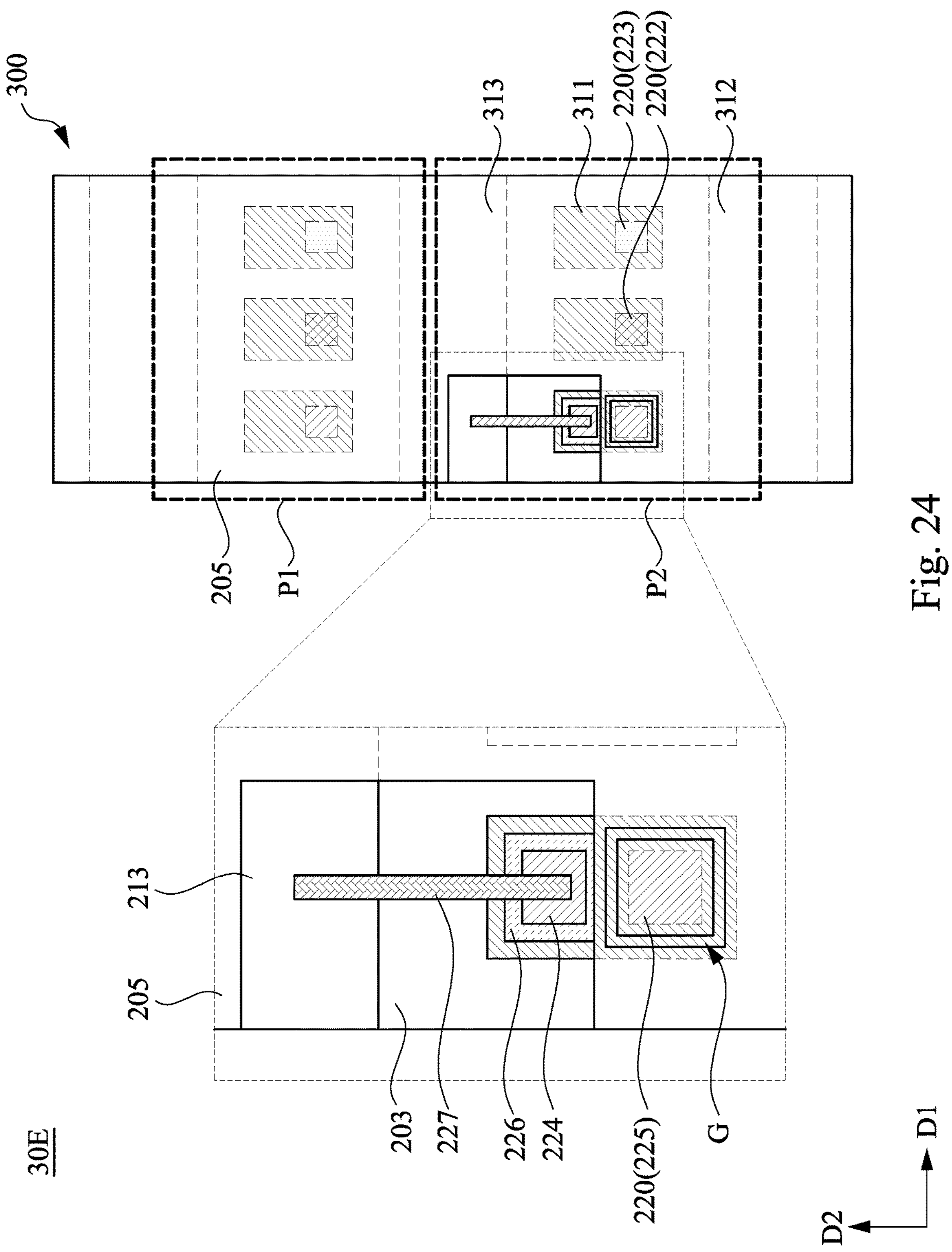
FIG. 24 is a partial top view of a light-emitting panel according to some embodiments of the present disclosure.

Reference is made to FIG. 24. FIG. 24 is a partial top view of a light-emitting panel 30E according to some embodiments of the present disclosure. The difference between the light-emitting panel 30E and the light-emitting panel 20E is that, as shown in FIG. 24, the light-emitting panel 30E includes a circuit board 300. The light-emitting panel 30E has the same structure as the light-emitting panel 20E in a cross-sectional view along a line corresponding to the line 23 of the light-emitting panel 20E.

In some embodiments, missing light-emitting units 220 during the manufacturing process fail the light-emitting panels. Therefore, during repair, the substitute electrode pads, such as the third electrode pad 213, are exposed and some functioning light-emitting units identical to the missing light-emitting units 220 are disposed on the substitute electrode pads. For example, a substitute light-emitting unit 224, which is the same vertical light-emitting diode as the missing light-emitting unit 221 (referring to FIG. 10), is disposed on the first electrode pad 211, and an insulating material is filled back. Then, the substitute light-emitting unit 224 is electrically connected to the third electrode pad 213 through a transparent conductive material or a nanowire extending from the electrode of the substitute light-emitting unit 224 over the insulating material and the second insulating layer 204.

For example, reference is made to FIG. 25. FIG. 25 is a partial top view of a light-emitting panel 20F according to some embodiments of the present disclosure. As shown in FIG. 25, the difference between the light-emitting panel 20F and the light-emitting panel 20D is that the first electrode pad 211 of the light-emitting panel 20F does not include a residual solder layer 202'.

Figure 26:
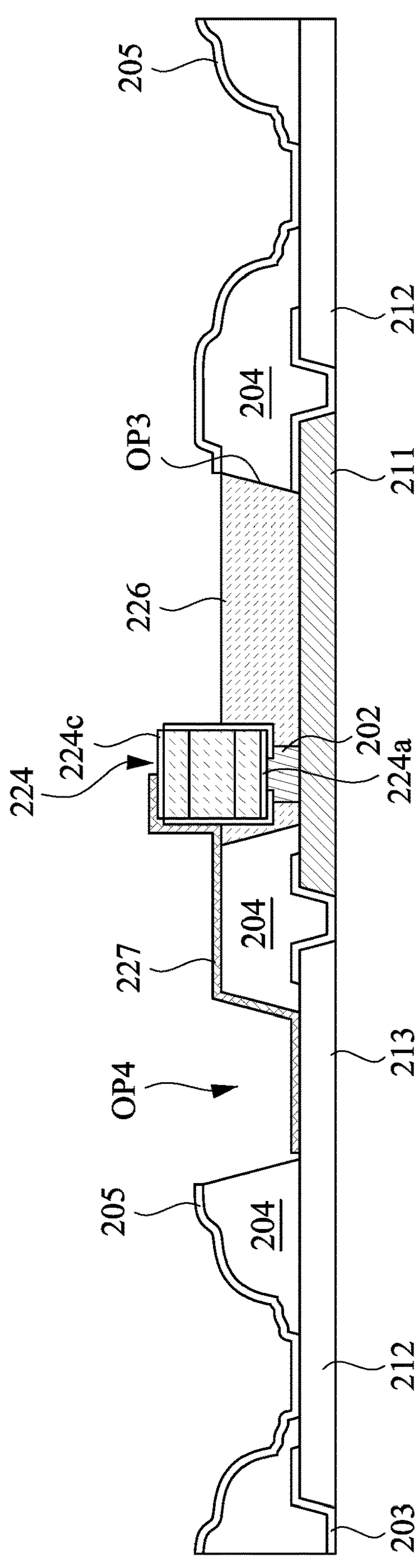
FIG. 26 is a partial cross-sectional view of a light-emitting panel along a line 26 in FIG. 25 according to some embodiments of the present disclosure.

Reference is made to FIG. 26. FIG. 26 is a partial cross-sectional view of the light-emitting panel 20F along a line 26 in FIG. 25 according to some embodiments of the present disclosure. As shown in FIG. 26, the light-emitting panel 20F includes a substitute light-emitting unit 224 disposed on the first electrode pad 211. At the same time, the first electrode pad 211 does not include a residual solder layer 202'.

Reference is made to FIG. 27. FIG. 27 is a partial top view of a light-emitting panel 30F according to some embodiments of the present disclosure. The difference between the light-emitting panel 30F and the light-emitting panel 20F is that, as shown in FIG. 27, the light-emitting panel 30F includes a circuit board 300. The light-emitting panel 30F has the same structure as the light-emitting panel 20F in a cross-sectional view along a line corresponding to the line 26 of the light-emitting panel 20F.

According to the foregoing recitations of the embodiments of the disclosure, it may be seen that in the circuit board and the light-emitting panel with the circuit board of some embodiments of the present disclosure, by disposing the substitute electrode pad in the direction along which the electrode pads electrically connected to the light-emitting unit are aligned, the electrode pads and the substitute electrode pad may be arranged more densely. Therefore, the light-emitting panel can have a higher pixel density while retaining space for repair. In addition, an insulating layer is disposed to cover the substitute electrode pad during mass transfers. An opening for exposing the substitute electrode pad is formed only during repair. This can prevent contamination of the substitute electrode pad during the mass transfers and bonding processes of the light-emitting unit. Therefore, the circuit board and the light-emitting panel with the circuit board in some embodiments of the present disclosure can effectively improve the success rate of repair.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A circuit board, comprising:

a plurality of pixel areas, wherein each of the pixel areas comprises:

a plurality of electrode pad groups arranged in a first direction, wherein each of the electrode pad groups comprises a first electrode pad, a second electrode pad, and a third electrode pad, wherein the first electrode pad, the second electrode pad, and the third electrode pad are arranged in a second direction, the second direction is different from the first direction, the first electrode pad is disposed between the second electrode pad and the third electrode pad, the first electrode pad is configured to provide a first voltage potential, the second electrode pad and the third electrode pad are configured to provide a second voltage potential, and the first voltage potential is different from the second voltage potential, wherein the third electrode pad of at least one of the electrode pad groups of the pixel areas is completely covered by an insulating layer.

2. The circuit board of claim 1, wherein in any two adjacent pixel areas in the second direction, the second electrode pad of the electrode pad groups of one of the two adjacent pixel areas and the third electrode pad of the electrode pad groups of the other of the two adjacent pixel areas form a continuous structure.

3. The circuit board of claim 1, wherein the second electrode pads of any two adjacent electrode pad groups form a continuous structure.

4. The circuit board of claim 1, wherein the third electrode pads of any two adjacent electrode pad groups form a continuous structure.

5. A light-emitting panel, comprising:

a circuit board comprising:

a plurality of pixel areas, wherein each of the pixel areas comprises:

a plurality of electrode pad groups arranged in a first direction, wherein each of the electrode pad groups comprises a first electrode pad, a second electrode pad, and a third electrode pad, wherein the first electrode pad, the second electrode pad, and the third electrode pad are arranged in a second direction, the second direction is different from the first direction, the first electrode pad is disposed between the second electrode pad and the third electrode pad, the first electrode pad is configured to provide a first voltage potential, the second electrode pad and the third electrode pad are configured to provide a second voltage potential, and the first voltage potential is different from the second voltage potential;

a plurality of light-emitting units arranged in the first direction, disposed in the pixel areas, and corresponding to the electrode pad groups, wherein each of the light-emitting units comprises a first electrode and a second electrode, the first electrode is electrically connected to the first electrode pad of a corresponding one of the electrode pad groups, and the second electrode is electrically connected to the second electrode of the corresponding one of the electrode pad groups; and an insulating layer completely covering the third electrode pad of at least one of the electrode pad groups of the pixel areas.

6. The light-emitting panel of claim 5, further comprising a substitute light-emitting unit in a first one of the pixel areas, wherein the substitute light-emitting unit corresponds to a first one of the electrode pad groups in the first one of the pixel areas, the substitute light-emitting unit comprises a first electrode and a second electrode, the first electrode of the substitute light-emitting unit is electrically connected to the first electrode pad of the first one of the electrode pad groups, and the second electrode of the substitute light-emitting unit is electrically connected to the third electrode pad of the first one of the electrode pad groups.

7. The light-emitting panel of claim 6, wherein a residual conductive material exists on the first electrode pad connected to the first electrode of the substitute light-emitting unit.

8. The light-emitting panel of claim 6, further comprising a first light-emitting unit disposed on one of the first electrode pad and the second electrode pad of the first one of the electrode pad groups, wherein the first light-emitting unit emits light of a same color as light emitted by the substitute light-emitting unit and is electrically disconnected from the other of the first electrode pad and the second electrode pad of the first one of the electrode pad groups.

9. The light-emitting panel of claim 6, wherein the insulating layer laterally surrounds the light-emitting units, the insulating layer has an opening exposing the third electrode pad of the first one of the electrode pad groups, and the insulating layer covers the third electrode pads of the rest of the electrode pad groups.

10. The light-emitting panel of claim 9, wherein the opening further exposes the first electrode pad of the first one of the electrode pad groups and is configured to accommodate the substitute light-emitting unit.

11. The light-emitting panel of claim 9, wherein the opening further exposes the first electrode pad and the second electrode pad of the first one of the electrode pad groups and is configured to accommodate the substitute light-emitting unit.

12. The light-emitting panel of claim 9, wherein the insulating layer has another opening so as to expose the first electrode pad of the first one of the electrode pad groups and accommodate the substitute light-emitting unit.

13. The light-emitting panel of claim 6, wherein the first electrode pad has a contact surface, and a width of the contact surface in the second direction is greater than a sum of half a width of the substitute light-emitting unit and a width of any one of the light-emitting units.

14. The light-emitting panel of claim 6, wherein the first electrode pad has a contact surface, and a width of the contact surface in the second direction is greater than twice a width of the substitute light-emitting unit.

15. The light-emitting panel of claim 6, wherein the light-emitting units corresponding to the rest of the electrode pad groups in the first one of the pixel areas emit light of a different color from light emitted by the substitute light-emitting unit.

16. The light-emitting panel of claim 6, wherein the first electrode pad of the first one of the electrode pad groups has a bonding area and a substitute bonding area, and the substitute light-emitting unit is disposed in the substitute bonding area.

17. The light-emitting panel of claim 16, further comprising a second light-emitting unit disposed on the first electrode pad of the first one of the electrode pad groups, wherein the second light-emitting unit emits light of a same color as light emitted by the substitute light-emitting unit, and the second light-emitting unit is disposed in the bonding area of the first electrode pad.

18. The light-emitting panel of claim 5, wherein the insulating layer laterally surrounds the light-emitting units and covers the third electrode pad of each of the electrode pad groups.

19. The light-emitting panel of claim 5, wherein each of the light-emitting units is disposed above the first electrode pad of the corresponding one of the electrode pad groups.

20. The light-emitting panel of claim 5, wherein each of the light-emitting units is disposed above the second electrode pad of the corresponding one of the electrode pad groups.

* * * * *